US011967938B2

(12) United States Patent
Bywalez et al.

(10) Patent No.: US 11,967,938 B2
(45) Date of Patent: Apr. 23, 2024

(54) CORROSION RESISTANT PAD FOR ENHANCED THIN FILM ACOUSTIC PACKAGING (TFAP)

(71) Applicant: RF360 SINGAPORE PTE. LTD., Singapore (SG)

(72) Inventors: Robert Felix Bywalez, Munich (DE); Ute Steinhaeusser, Munich (DE)

(73) Assignee: RF360 SINGAPORE PTE. LTD., Singapore (SG)

(*) Notice: Subject to any disclaimer, the term of this patent is extended or adjusted under 35 U.S.C. 154(b) by 395 days.

(21) Appl. No.: 17/223,923

(22) Filed: Apr. 6, 2021

(65) Prior Publication Data
US 2022/0321077 A1   Oct. 6, 2022

(51) Int. Cl.
H03H 3/02       (2006.01)
H03H 9/17       (2006.01)
H03H 9/56       (2006.01)

(52) U.S. Cl.
CPC ............. H03H 3/02 (2013.01); H03H 9/173 (2013.01); H03H 9/564 (2013.01); H03H 2003/021 (2013.01)

(58) Field of Classification Search
CPC ............................... H03H 9/173; H03H 9/564
See application file for complete search history.

(56) References Cited

U.S. PATENT DOCUMENTS

| | | | |
|---|---|---|---|
| 2010/0148638 A1 | 6/2010 | Umeda | |
| 2017/0244380 A1 | 8/2017 | Stokes et al. | |
| 2020/0014364 A1 | 1/2020 | Stokes et al. | |
| 2020/0244222 A1* | 7/2020 | Umeda | ............... H03H 9/1057 |
| 2021/0006226 A1* | 1/2021 | Lee | ............... H03H 9/02015 |

OTHER PUBLICATIONS

Lobeek J-W., et al., "Design and Industrialisation of Solidly-Mounted BAW Filters", IEEE Microwave Symposium Digest, Jun. 2006, pp. 386-389, XP031018493.
Partial International Search Report—PCT/EP2022/055642—ISA/EPO—dated Jul. 7, 2022.
International Search Report and Written Opinion—PCT/EP2022/055642—ISA/EPO—Oct. 19, 2022.

* cited by examiner

Primary Examiner — Samuel S Outten
(74) Attorney, Agent, or Firm — Muncy, Geissler, Olds & Lowe, P.C.

(57) ABSTRACT

An apparatus and method for making an acoustic filter package where the apparatus includes a base layer; a support layer disposed on the base layer; a piezoelectric structure disposed on the support layer; wherein the piezoelectric structure comprises: a piezoelectric layer; a top electrode on a top surface of the piezoelectric layer; a bottom electrode on a bottom surface of the piezoelectric layer; a contact pad coupled to the bottom electrode that extends through an opening in the piezoelectric layer and is coupled to the bottom electrode or the top electrode; and a corrosion resistant pad disposed on the contact pad; and a capping structure disposed on the piezoelectric structure.

56 Claims, 18 Drawing Sheets

Capping (CA) Release
- SiO₂ dry etch
- Release of Sacrificial Resist

Sealing (SE)
- Deposition of BCB

Sealing (SE) Structuring
- Structuring of BCB
- Curing of BCB

CORROSION RESISTANT PAD FOR ENHANCED THIN FILM ACOUSTIC PACKAGING (TFAP)

FIELD OF DISCLOSURE

This disclosure relates generally to integrated circuit (IC) and microelectromechanical systems (MEMS) packages, and more specifically, but not exclusively, to corrosion or chemically resistant pads for use in a device package such as a thin film acoustic package (TFAP).

BACKGROUND

Modern electronics are becoming more prevalent as smaller electronics and package geometries enable more applications for the small electronics. One of the basic components of modern electronics is the integrated circuit (IC) package. The IC package provides support, protection, and routing paths for the electronics in the IC package, such as logic die, semiconductor die, active devices, and passive devices.

There is a continuous demand to reduce or miniaturize the size or footprint of conventional IC packages, while also minimizing and helping to protect against the harmful effects of corrosion and any other harmful chemicals or adverse oxidations encountered during the manufacturing process. Various components, such as electrical pads, may corrode or be damaged because of different mechanisms or process steps. This could adversely impact their functionality, performance and future reliability.

Accordingly, there is a need for apparatus and methods that overcome the deficiencies of conventional approaches, including the apparatus and methods provided herein.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In one aspect, an apparatus including an acoustic filter package and further comprising a base layer; a support layer disposed on the base layer; a piezoelectric structure disposed on the support layer; wherein the piezoelectric structure further comprises: a piezoelectric layer; a top electrode on a top surface of the piezoelectric layer; a bottom electrode on a bottom surface of the piezoelectric layer; a contact pad coupled to the bottom electrode that extends through an opening in the piezoelectric layer and is coupled to the bottom electrode or the top electrode; and a corrosion resistant pad disposed on the contact pad; and a capping structure disposed on the piezoelectric structure.

In another aspect, a method for forming an apparatus including an acoustic filter package and further comprising: forming a base layer; forming a support layer disposed on the base layer; forming a piezoelectric structure disposed on the support layer; wherein the piezoelectric structure further comprises: forming a piezoelectric layer; forming a top electrode on a top surface of the piezoelectric layer; forming a bottom electrode on a bottom surface of the piezoelectric layer; forming a contact pad coupled to the bottom electrode that extends through an opening in the piezoelectric layer and is coupled to the bottom electrode or the top electrode; and forming a corrosion resistant pad disposed on the contact pad; and a capping structure disposed on the piezoelectric structure.

Other features and technical advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

Figure 1A:
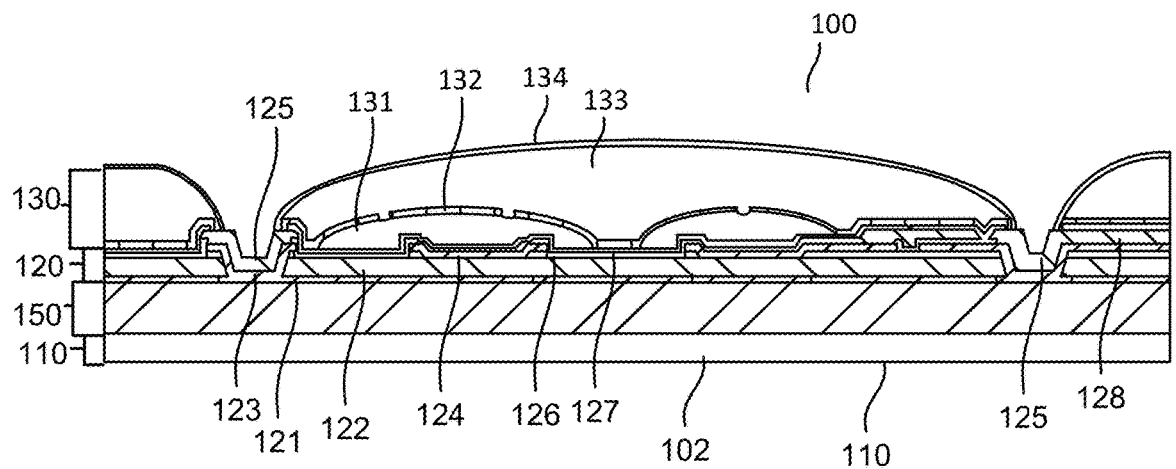
FIGS. 1A-1C illustrate some exemplary package configurations in accordance with some examples of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all of the components of a particular apparatus or method. Further, like reference numerals denote like features throughout the specification and figures.

DETAILED DESCRIPTION

The exemplary methods, apparatus, and systems disclosed herein mitigate shortcomings of the conventional methods, apparatus, and systems, as well as other previously unidentified needs. Those of skill in the art will appreciate that the disclosure applies to surface acoustic wave (SAW) filters and bulk acoustic wave (BAW) filters and other related technologies, without departing from the spirit and scope of the disclosure.

For example, examples herein include, the covering of an electrical contact (e.g. an EPAD) with a corrosion resistant layer without requiring an extra process or manufacturing step to implement this covering. Conventional methods use probing through a corrosion resistant layer, utilizing a different trimming approach, and applying an alternative chemistry.

One exemplary usage is shielding of helping to protect any electrical contact if they are exposed to a corrosive substance or a harsh chemical environment will be encountered in the manufacturing process. In one aspect, EPADs enable excellent electrical contact and these EPADs act like electrical highways for internal and external connections and communications within the packages, and they can facilitate data, voltage, current, signal, and other transmissions.

One technical advantage over the related art is that this method can be manufactured in a one chamber process, where no additional processes or processing steps are needed. This provides several advantages, such as saving space, time, money, etc. As an example, the EPAD surface will not degrade or decompose in a low concentration hydrogen chloride (HCL) atmosphere, as well as the testing and layer stack not being affected in any deleterious manner. Also, the better resolved SL shape allows the use of smaller die sizes and shorter electrical paths, while protecting the underlying structure. This allows higher circuit densities and levels of miniaturization, improved production yields, higher power capability and the more efficient use of any available integrated circuit real estate.

The disclosed packages may also be incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle. It should be also understood that the devices and methods shown and described herein may omit descriptions and/or illustrations of conventional package assembly components or activities in the interest of brevity without prejudice or disclaimer.

Figure 3:
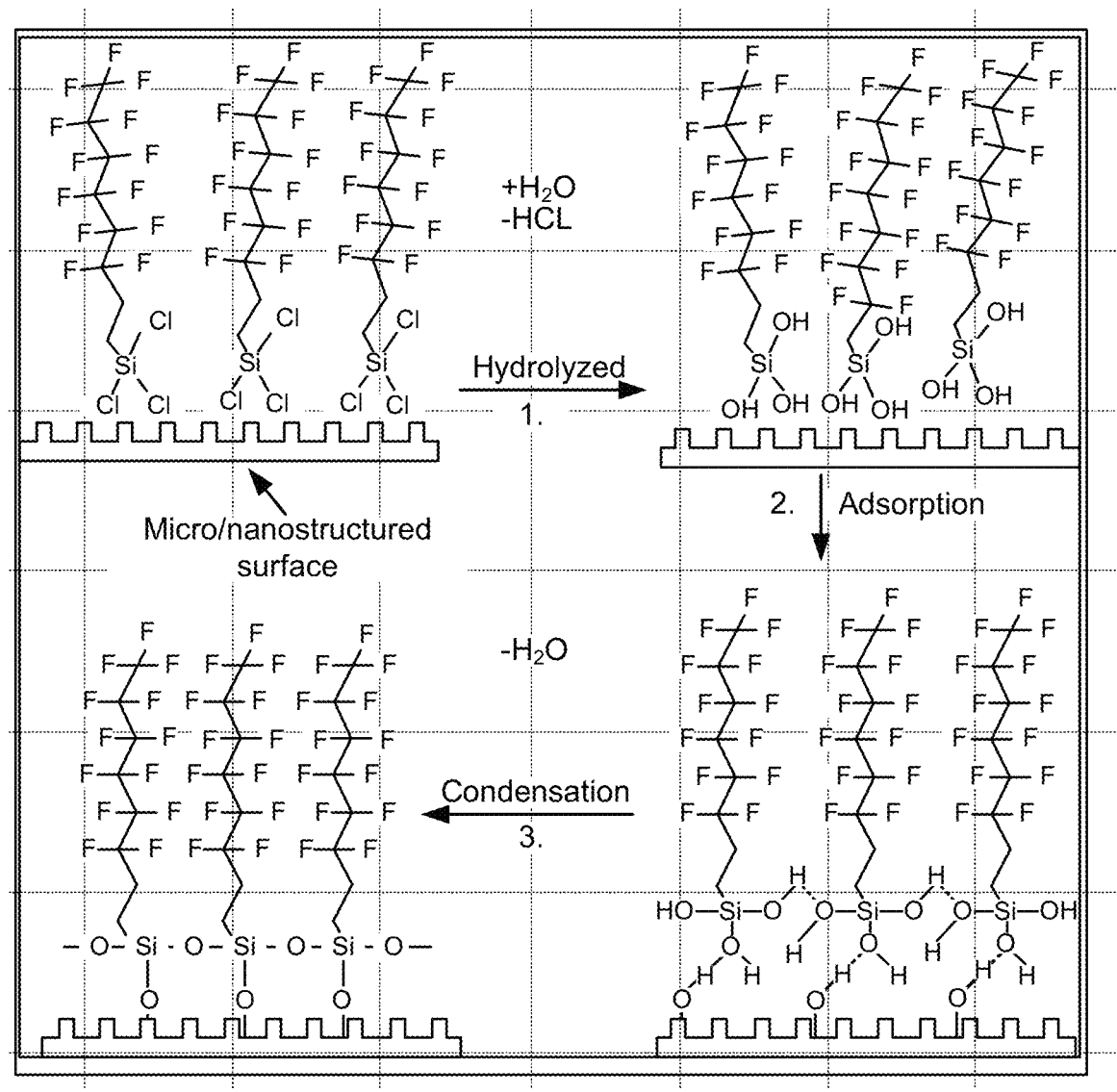
FIG. 3 illustrates an exemplary Fluoro-Silane passivation process in accordance with some examples of the disclosure.

Some of the relevant technical advantages of one exemplary embodiment is enabling the usage of new manufacturing processes and techniques. Although many passivation techniques may be used to resolve the sacrificial layer (SL) structures better, the Fluoro-Silane passivation shown in FIG. 3 is one technique that works well and is well known in the art.

However, the use of this passivation process releases harmful substances during the manufacturing process. For example, hydrogen chloride (HCl is corrosive to metals, such as the aluminum (Al) in the EPAD (or any other electrical contact forms). One could use other chemistries and substances to avoid the harmful effects of HCl, however they are either too slow, do not scale well, or are not readily available for industrial or commercial applications. In other words, they would add additional costs and delays which are not a desired outcome.

Some packages and technologies for spectral multiband resonators (SMR) also require electrical accessibility (e.g. electrical test probing), due to the need to perform frequency measurements and to also support any necessary tuning required for any devices located on the packages (such as the resonators found on a TFAP). Also, if any additional layers are added or introduced during manufacturing, they may alter or influence the stack and consequently the frequency characteristics of the device. That is one of the reasons why achieving this level of protection, without needing any additional manufacturing or processing steps is such a significant and desired technical advantage.

The aspects disclosed herein may be used with many different applications and filter types. Some exemplary applications of these packages and technologies are RF devices such as bulk acoustic wave (BAW), surface acoustic wave (SAW) and thin film acoustic package (TFAP). The Assignee of this patent, Qualcomm Corporation, has also registered TFAP® as a registered mark. For purposes of this disclosure, the general TFAP acronym representing a thin film acoustic package will be used, and not the specific registered mark of Qualcomm Corporation.

Acoustic filters are commonly used in mobile communication applications. They can operate in a wide-ranging band of many frequency ranges, with frequencies ranging from very high to very low. They offer excellent packaging densities, since they are small in physical size and overall physical geometries. They do all of this while offering a high performance and cost-effective solution to filtering applications. The technical advantages of the present disclosure may be used in SAW and BAW filter applications.

SAW filters are widely used in receivers, duplexers and receive filters. SAW filters combine low insertion loss with good rejection characteristics. Because SAW filters are fabricated on wafers, they can be manufactured at relatively high production volumes with low costs.

BAW filters are compact, low cost RF filters. They generally operate by converting electrical energy into acoustic or mechanical energy on a piezoelectric material. When compared to surface acoustic wave (SAW) filters, BAW filters can operate at higher frequencies, and are less sensitive to temperature changes or fluctuations. They are especially suited for applications where challenging interference problems exist.

The basic principle of these devices is the generation of elastic surface waves caused by electrical signals and their reconversion. A semiconductor substrate underlies the package and interconnect structure. Some of examples of semiconductor substrates are bulk silicon or silicon-on-insulator (SOI) substrates.

In one example, the substrate material is a piezoelectric crystal such as Quartz (SiO2), Aluminum Nitride (possibly doped with Scandium if desired), Lithium Tantalate (LiTaO3) or Lithium Niobite (LiNbO3). These are examples of single crystal materials which are cut out after the growing process and possessing a defined orientation. Please note that the Scandium doping is optional.

The following discussion and disclosure aspects will be discussed in reference to BAW filters, however those skilled in the art will appreciate that these technical advantages may be used with SAW filters and other technologies just as well.

BAW filters and TFAP devices can be used to remove signals in unwanted frequency ranges. They are commonly used in various wireless frequency communication devices, such as mobile phones.

Typically, a BAW filter has a BAW resonator fabricated on a silicon or glass substrate. BAW filters are usually compact, lower cost RF filters. Like surface acoustic wave (SAW), BAW filters operate by converting electrical energy into acoustic or mechanical energy on a piezoelectric material or substrate. Furthermore, compared to SAW filters, BAW filters can operate at higher frequencies, and are less sensitive to temperature changes or fluctuations.

BAW filters typically use a quartz crystal substrate with metal electrodes or patches on the top and bottom sides of the silicon wafer. The metal electrodes excite the formation of acoustic waves. These acoustic waves propagate vertically between them to form a standing acoustic wave. The resulting resonant frequency is partly determined by the thickness of the quartz crystal substrate and the mass of the electrodes.

To keep the waves from escaping into the substrate, there are two main configurations of BAW filters known in the related art. The other configuration is a solidly mounted resonator (SMR). The proliferation of die-sized SAW packaging and TFAP has enabled reductions of up to 65% (or even more) for RF components, when compared to first generation chip-sized SAW packaging (CSSP).

FIGS. 1A-1G illustrate some exemplary package configurations in accordance with some examples and different aspects of the disclosure.

Referring to FIG. 1A, an apparatus for an acoustic filter package 100 is shown and includes a base layer 110 and a support layer 150 disposed on the base layer. The base layer 110 further includes a substrate 102 and a passivation layer 104 disposed on the substrate. The passivation layer may also be a native part of the substrate, for example, a native SiO2 layer on top of a Si Wafer.

The support layer 150 includes one or more dielectric layers (153, 155). A piezoelectric structure 120 is also shown disposed on the support layer 150.

In one aspect, the support layer 150 includes one or more metal layers (152, 154) and each metal layer is separated by at least one of the one or more dielectric layers (153, 155). Additionally, the one or more metal layers (152, 154) includes a first metal layer 152 disposed on the base layer 110 forming a first plurality of mirrors and a second metal layer 154 forming a second plurality of mirrors, wherein the second metal layer is adjacent the piezoelectric structure 120 and above the first metal layer 152. In one aspect, the one or more metal layers (152, 154) each may comprise tungsten (W) deposited on titanium (Ti).

Generally, heavy metal elements with higher weights on the Periodic Table would also work, however there may be fiscal prohibitions that would need to be considered in selecting these different options.

The piezoelectric structure 120 includes a piezoelectric layer 122, with a top electrode 124 on a top surface of the piezoelectric layer and a bottom electrode 121 on a bottom surface of the piezoelectric layer. A capping structure 130 is disposed on the piezoelectric structure 120. A capping layer 132 is deposited over the piezoelectric structure 120, wherein the capping layer 132 forms an air gap 131 over the top electrode 124. In one example, the piezoelectric layer is aluminum scandium nitride (AlScN). Other options may be used to form the piezoelectric layer, such as using aluminum nitride without the scandium.

The piezoelectric structure 120 may include a first dielectric layer 126 deposited over the piezoelectric structure 120, the top electrode 124 and at least partially over the contact pad 123. A second dielectric layer 127 is deposited over the first dielectric layer 126 and at least partially over the corrosion resistant pad 125. In one aspect, the first dielectric layer and the second dielectric layer are both silicon nitride (SiN).

The capping structure further includes a sealing layer 133 deposited over the capping layer 132, wherein the capping layer forms an air gap 131 over the top electrode 124 and a reinforcement layer 134 deposited over a sealing layer 133.

In one aspect, the capping layer is SiO2 or silicon nitride (SiN), the sealing layer is Benzocyclobutene (BCB) and the reinforcement layer is silicon nitride. The reinforcement layer may be an optional design element, especially as materials science and manufacturing processes advance.

A contact pad 123 is coupled to the bottom electrode that extends through an opening in the piezoelectric layer and is coupled to a bottom electrode or a top electrode.

At the contact pad 123 itself, it is either coupled to a bottom electrode or a top electrode, but not both. At all other locations, it can be coupled to a bottom electrode or a top electrode. At the resonator, it will have both a bottom and a top electrode.

A corrosion resistant pad 125 is disposed on the contact pad and an extended portion 128 of the corrosion resistant pad is also shown. In one aspect, the corrosion resistant pad is generally circular in shape.

Those skilled in the art will appreciate that in addition to the corrosion resistant pad being generally circular in shape, the corrosion resistant pads may be any geometric configuration, such as rectangular, square, polygonal, quadratic, elliptical, etc. Also, the various geometric shapes may also be used in various combinations with each other. In other words, one corrosion resistant pad geometry does not have to be used throughout but can be used in combination.

The corrosion resistant pad may be formed from multiple layers. In another aspect, the corrosion resistant pad is formed form a corrosion resistant layer deposited on a seed layer. These seed layers (e.g. titanium) will be discussed later and are optional ways of improving the adhesion between layers.

In one aspect, the corrosion resistant layer is formed from a plurality of layers. This plurality of layers may include Molybdenum (Mo) deposited on gold (Au) deposited on Molybdenum (Mo). In another aspect, the plurality of layers may include Molybdenum (Mo) deposited on Tungsten (W).

In FIG. 1A, a substrate 102 may be made of silicon (Si) and the passivation layer 104 is silicon dioxide (SiO2).

One example of this electrical contact area can be an EPAD. There can also be additional distributed contact points located on a layer to facilitate electrical interconnections and communications used during the operation of the device.

In some aspects, located on the top of a passivation layer 104 (e.g. SiO2), may include mirrors, a bottom electrode, a piezoelectric (PZ) top electrode, etc. and may be formed from a variety of materials as are known, such as Ti, Cu, Al, Mo, W, SiO2. A base layer 110 may be a Si wafer substrate and may include a SiO2 passivation layer.

A sacrificial layer (SL) [more clearly illustrated in FIG. 6C as 619] (e.g., resist material which can be removed later), and capping structure 130 which also may act as a second insulating layer (e.g., SiN, SiO2). The SL is used to create the dome. Those of skill in the art will appreciate that other geometric structures besides a dome like structure could also be used. Any air gap possessing a sufficient resistance to an outward pressure or force would work. Domes and dome-like structures are especially well suited for these applications.

Figure 1B:
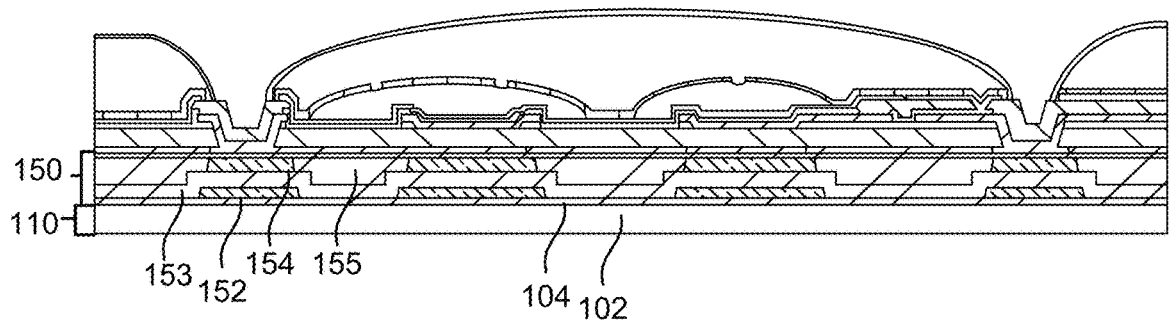
Figure 1C:
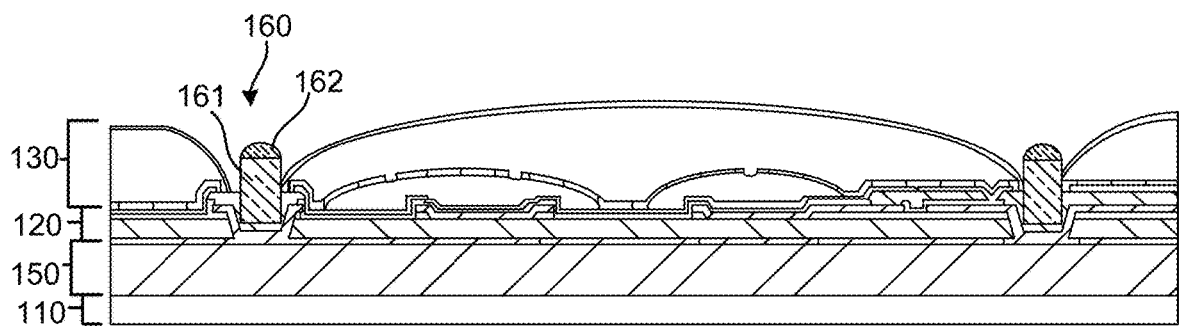

FIG. 1B and FIG. 1C show a full package configuration with interconnects at the pad shown. For ease of discussion, not all of the previously discussed reference numbers will be discussed going forward.

In FIG. 1B, dielectric layers 153 and 155 are shown. The support layer 150 includes one or more metal layers (152 and 154). A passivation layer 104 is disposed on the substrate 102.

FIG. 1C illustrate a full package with the interconnections at the contact or pad shown. FIG. 1C is also an illustration of another cross-sectional view of the package shown in FIG. 1B. A contact 160 is located above a corrosion resistant pad and is coupled to the contact pad 123 through an opening in the corrosion resistant pad. The contact 160 sits upon the corrosion resistant pad 125. It also includes a conductive pillar 161 and a solder bump 162. In one example, the conductive pillar 161 is made of copper (Cu). The conductive pillar may include a tin silver (SnAg) cap on the top part of the pillar. Other interconnect types may also be used, such as a solder bump.

In another aspect, the contact pad 123 is formed from multiple layers. The corrosion resistant pad 125 may be aluminum copper (AlCu) and in some aspects, may include all the various combinations shown in FIGS. 4 and 5. In one example, the contact pad 123 is formed from AlCu deposited on a seed layer. In another example the contact pad is at least one of aluminum (Al), copper (Cu), Al (Si, Pd, Sc) as well as all the possible combinations shown in FIGS. 4 and 5.

Figure 1D:
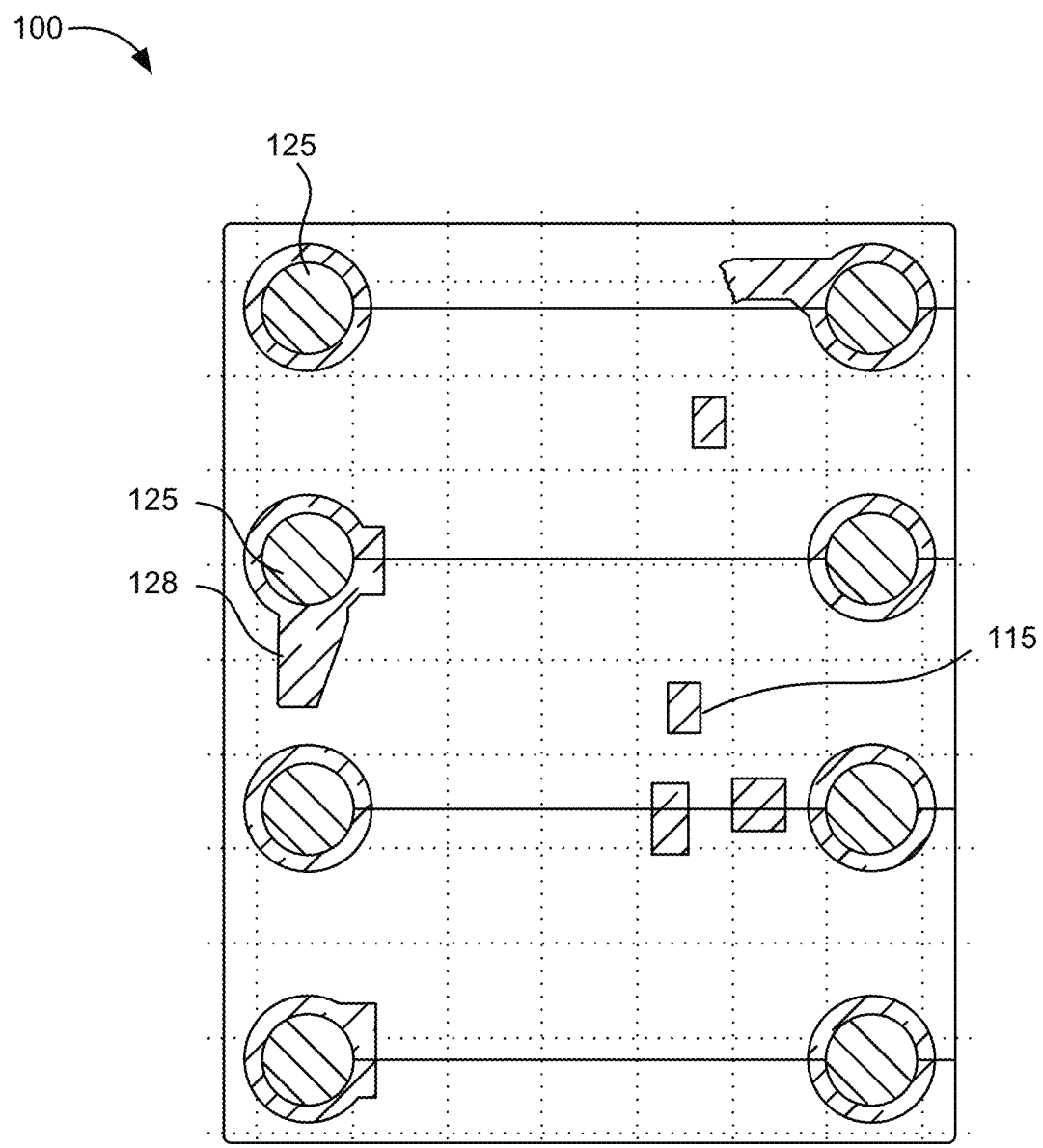
FIG. 1D illustrates an exemplary package configuration of a BAW filter in a TFAP configuration.

FIG. 1D illustrates another aspect of the acoustic filter package 100. The capacitors 115 may be located in various regions.

It will be appreciated the corrosion resistant pad 125, including extended portion 128, are present during the frequency tuning process. In some aspects, central portions of the corrosion resistant pad 125 may be partially removed after tuning (e.g., during the reinforcement layer structuring) before forming the interconnect. It will be appreciated that the pad extended portion 128 remains during and after forming the interconnect as well as outer portions of corrosion resistant pad 125.

Probes and interconnects can be placed at openings in a cover layer of an acoustic filter package. These openings provide access points for tuning of the TFAP during the fabrication process and/or subsequent connection to external circuits that will be used in operation. One may tune the frequency of the resonators while the corrosion resistant layers are still present. They may be removed before forming the interconnect during the manufacturing process. In the extend portion of the corrosion resistant pad 128, the corrosion resistant materials remain, as well as the corrosion resistant materials remaining in the outer ring parts of the corrosion resistant pad 125.

Figure 1E:
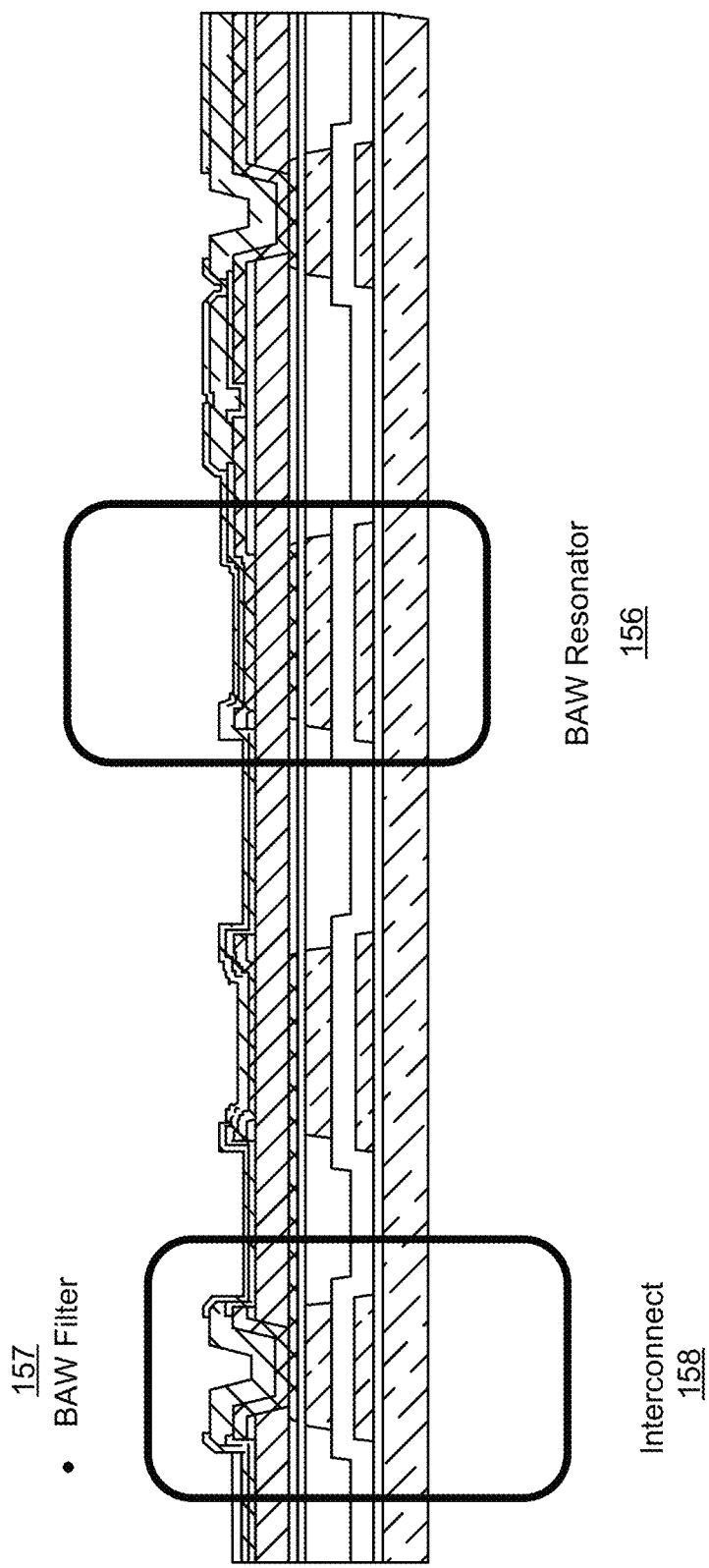
FIG. 1E illustrates an exemplary bulk acoustic wave (BAW) filter.

FIG. 1E illustrates an exemplary package configuration of a BAW filter 157. An exemplary material structure may Ti/Al, SiN, AlSc30N255, Mo, W on Ti, SiO2 and Si. Other material stacks and configurations may be used in accordance with other examples of the disclosure. Various sealing layers may be used to seal these structures. In some aspects, the package may include BCB as a sealing layer (not shown in the Figure).

FIG. 1E also illustrates a more focused region of an exemplary BAW filter 157 interconnect structure 158 and the BAW resonator portion 156. Some examples of these elements will be discussed in greater detail later in FIGS. 6A-H.

An exemplary material structure may include Ti/Al, SiN, AlSc30N255, Mo, W on Ti, SiO2 and Si. Various sealing layers may be used. A BCB sealing layer (again not shown in the Figure) may also be used with other material stacks and configurations.

Figure 2:
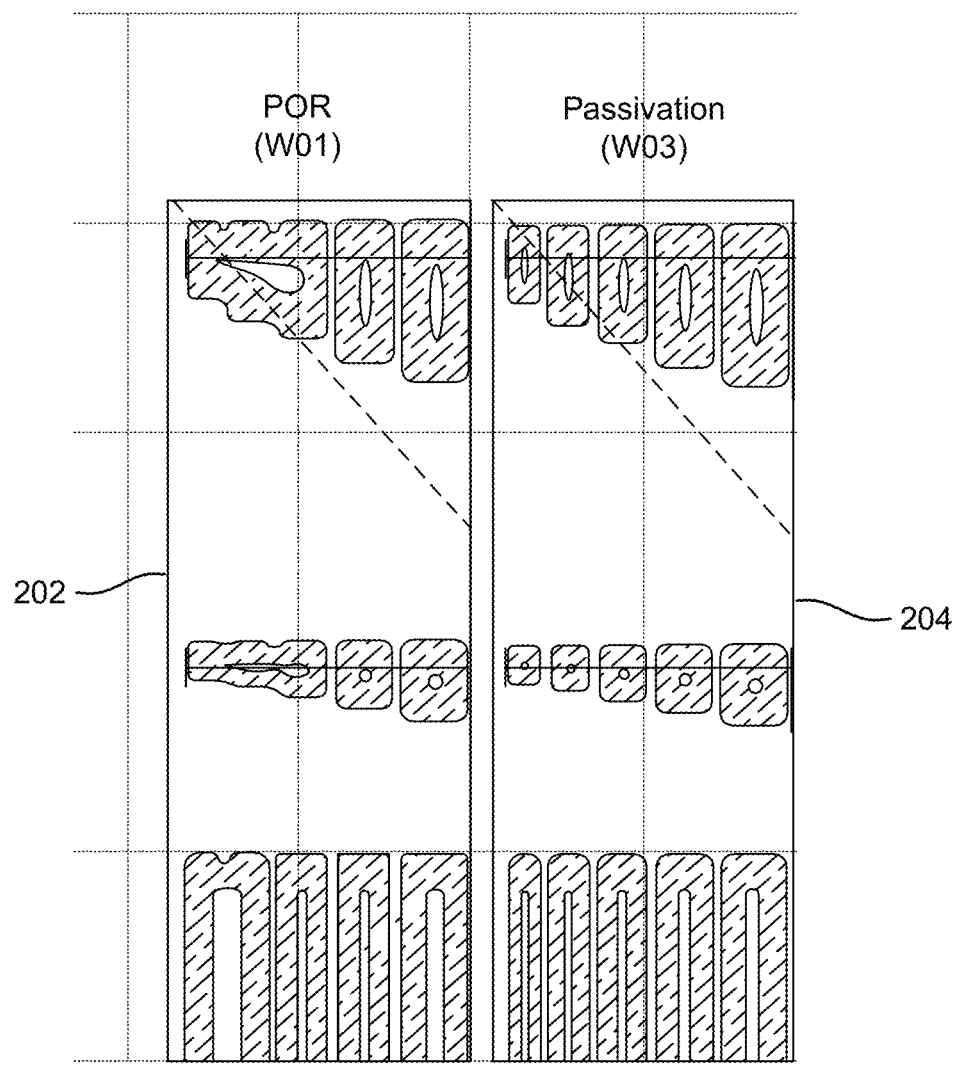
FIG. 2 illustrate an exemplary resolution comparison between a process of record (POR) and the disclosed passivation process in accordance with some examples of the disclosure.

FIG. 2, illustrates an exemplary resolution comparison between a conventional process of record (POR) 202 and the disclosed passivation process in accordance with some examples of the disclosure. As illustrated, the structures formed in portion 202 using the conventional process displays an inferior resolution and degraded delineations of the structures, when compared to the improved resolution, sharper delineations and tighter geometries shown in 204.

FIG. 3 illustrates an exemplary passivation process which can be used to manufacture the device disclosed herein. FIG. 3 shows the hydrolyzation of a micro/nanostructured surface, including the effects of adsorption and condensation. The resulting surface coverage has a controlled and enhanced hydrophobicity, thereby resulting in the improved resolutions, sharper delineations and geometries as previously shown in FIG. 2 (204).

Figure 4A:
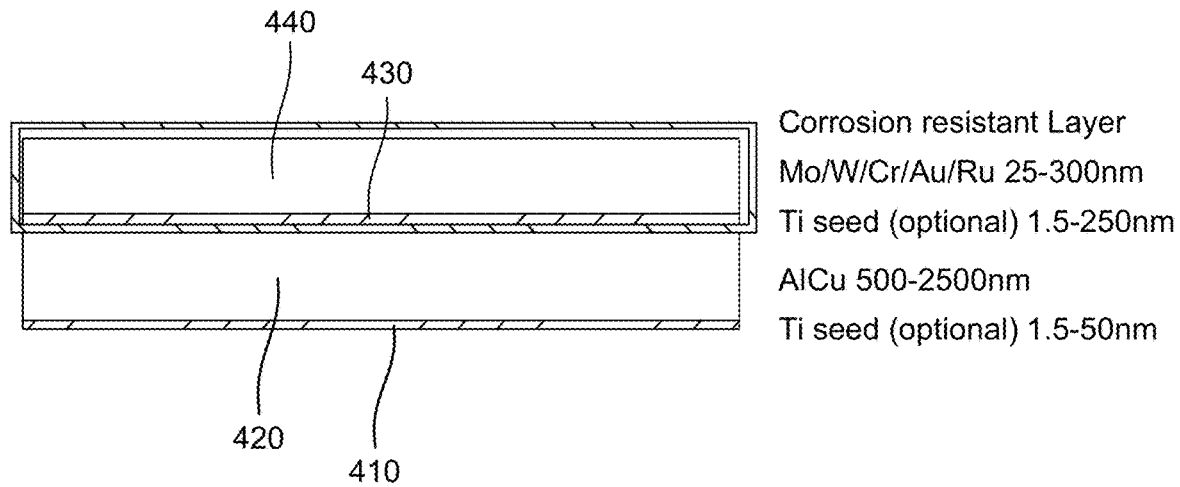
FIGS. 4A-4B illustrate exemplary corrosion resistant layers stacked in accordance with one example of the disclosure.

FIG. 4A illustrates an exemplary layered structure with a corrosion resistant layer. This corrosion resistant layer protects the device during the manufacturing process from harmful chemicals, acids and other substances which may be encountered. The corrosion resistant layer can be removed later with a selective etching process.

In FIG. 4A, two optional Ti seed layers (410, 430) for a conductive layer are shown. A conductive layer 420 is shown and may also be used to form the contact pads. These optional Ti seed layers are used to increase and improve the adhesion between seed layers. The first optional bottom Ti seed layer may have a thickness of 1.5-50 nm. An exemplary AlCu layer of 500-2500 nm thickness may be placed above the bottom Ti seed layer. The optional top Ti seed layer may have a thickness of 1.5-250 nm.

In one aspect. a corrosion resistant layer includes at least one of Molybdenum (Mo), Tungsten (W), Chromium (Cr) and Ruthenium (Ru). [e.g. 25-300 nm thickness]

Figure 4B:
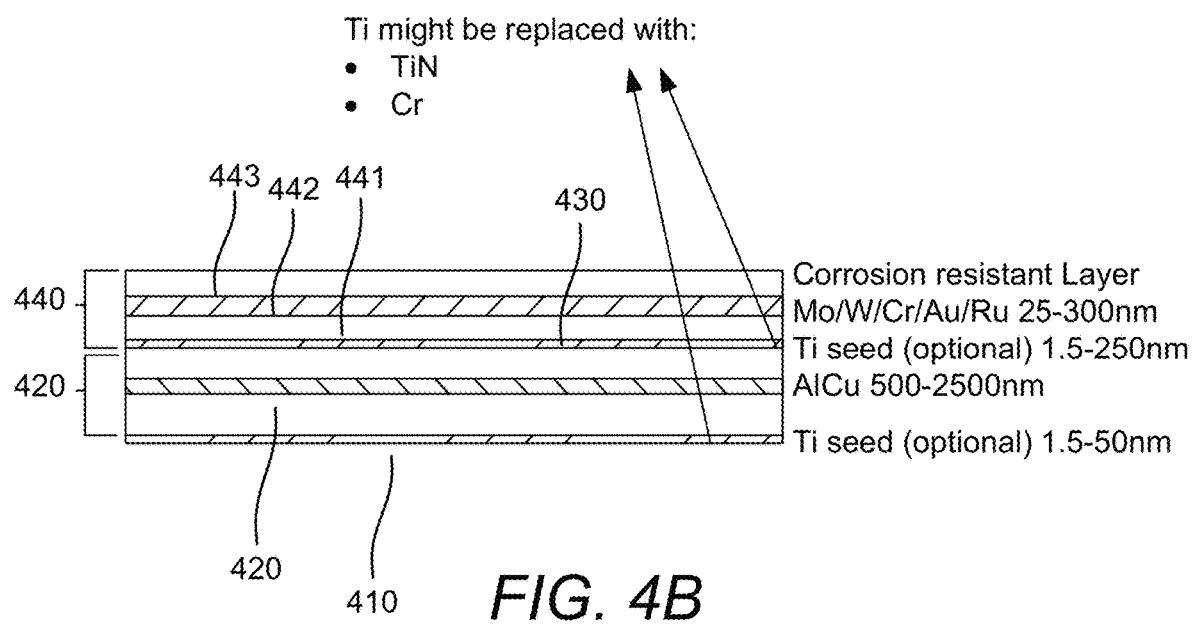

FIG. 4B illustrates an exemplary layered structure that is a layered, composite structure. FIG. 4B illustrates an alternative configuration with a corrosion resistant layer 440 being formed from three separate layers: first corrosion resistant layer 441, a second corrosion resistant layer 442 and a third corrosion resistant layer 443.

In FIG. 4B, two optional Ti seed layers (410, 430) for a conductive layer are shown. A conductive layer 420 is shown and may also be used to form the contact pads. These optional Ti seed layers are used to increase and improve the adhesion between seed layers. The first optional bottom Ti seed layer may have a thickness of 1.5-50 nm. An exemplary AlCu layer of 500-2500 nm thickness may be placed above the bottom Ti seed layer. The optional top Ti seed layer may have a thickness of 1.5-250 nm.

In one aspect. a corrosion resistant layer includes at least one of Molybdenum (Mo), Tungsten (W), Chromium (Cr) and Ruthenium (Ru). [e.g. 25-300 nm thickness]

Ti seed layers are typically used to enhance the adhesion qualities of the various subsequent layers added while constructing the layered structure. There are some layer configurations and material combinations that may adhere well, without the use of a Ti seed layer. However, these Ti seed layers are used when it is useful to improve the adhesion of multiple layers in those applications where some adherence issues may exist without their use. They may not be necessary, if there are no adherence issues during the layered structure construction process.

This layered, composite structure may result in improved structural integrity of the device and also facilitates the tuning of any resonators located on the device. It should be appreciated by those of skill in the art, that any of the corrosion resistant variants (no matter what layered configuration they use), may allow proper tuning, although multiple layered variants, may serve to improve the overall structure and/or conductivity.

The influence on the tuning process may be indirect. The EPAD with the corrosion resistant layer can be probed directly. If this is not done in this manner, one would probe through anon-conductive protections or open area prior to the probing activity. This could influence the mass loading on the resonator area.

The exemplary embodiment shown in FIG. 4 includes an additional HCl resistant layer on top of a typical EPAD. This allows the usage of Fluoro-Silane passivation process to achieve higher resolution and higher density structures, while mitigating the harmful effects caused by the release of HCl (or any other harmful substance encountered during manufacturing) which could destroy or degrade the electrical contacts.

Molybdenum (MO) is an excellent candidate for this application, since it does not damage any electrical test prober and is also easily removable for bumping. Other candidates could be used, such as Tungsten (W), Chromium (Cr), or Ruthenium (Ru) for example. As mentioned earlier, one exemplary layer thickness range is 25-300 nanometers (nm). An optional Ti seed layer of 1.5-250 nm can also be used. These optional Ti seed layers provide improved adhesion and potential etching or diffusion stops. They also reduce the formation of etch hillocks.

An aluminum copper (AlCu) layer is also shown. An exemplary layer thickness for this layer could be 500-2500 nm. An optional Titanium (Ti) seed layer of 1.5-50 nm can also be used here.

FIGS. 5A-5D illustrate some exemplary layer stacks. A bump area of BAW filter 500 is shown, with an illustration of an interconnected area 502 in FIG. 5A and a non-interconnected area 504 in Figure B. There are corrosion resistant layers (512, 514), a contact space 516, and an optional Ti seed layer 518. These optional Ti seed layers may also serve another form of corrosion resistant layer.

Figure 5A:
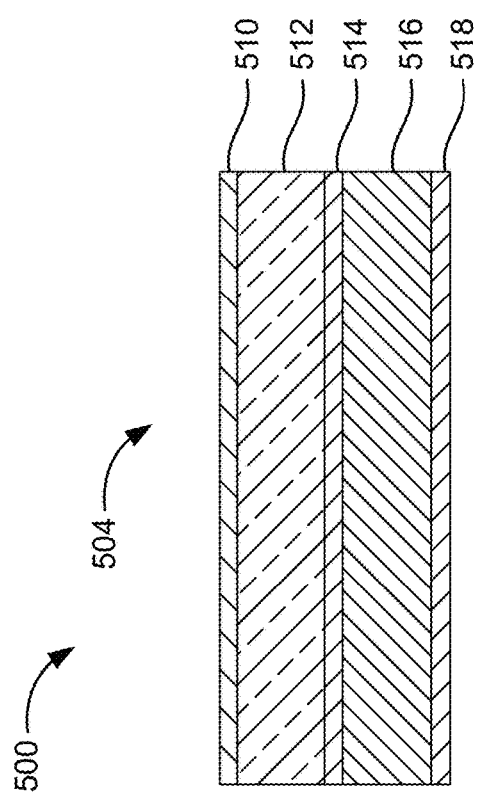
FIGS. 5A-5D illustrate exemplary comparisons between various package layers and a bump area.
Figure 5B:
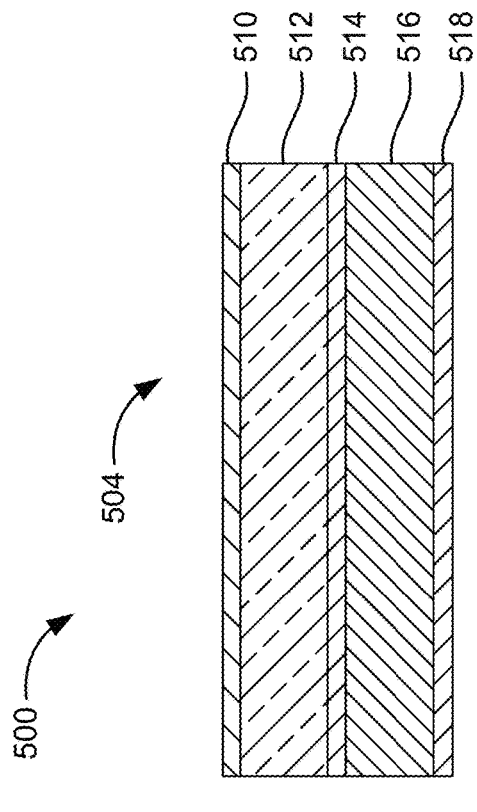

FIG. 5B shows a silicon nitride layer 510 on top of the other layers that were discussed in FIG. 5A.

Figure 5C:
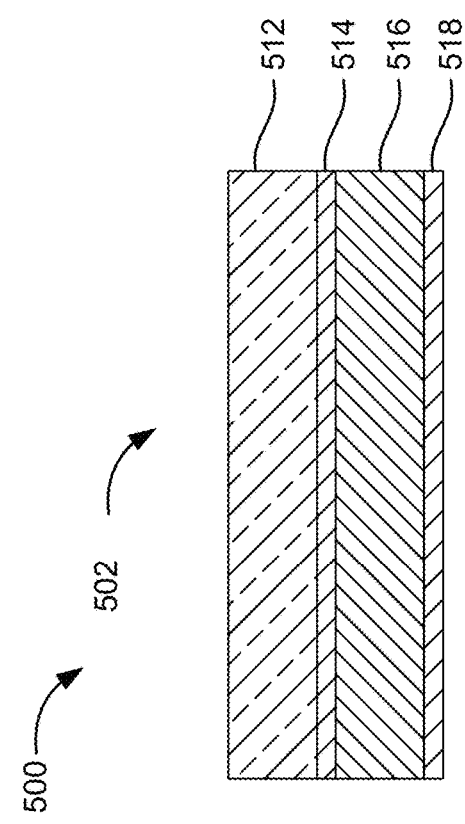
Figure 5D:
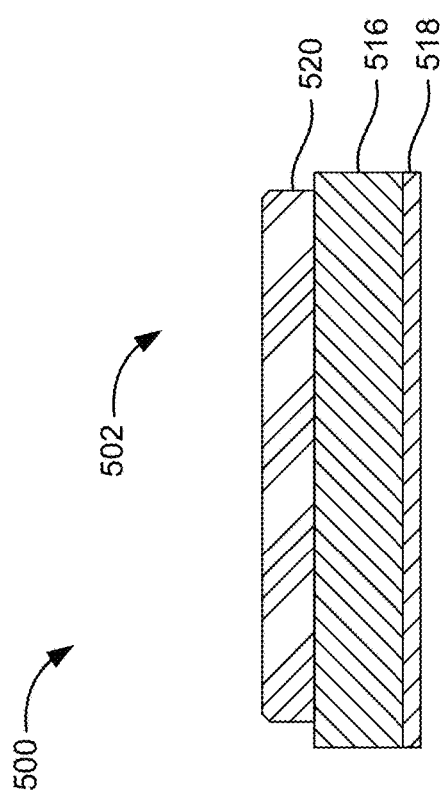

FIG. 5C illustrates an exposed contact interconnected area 502 showing an exposed structured interconnect/pad area 520. Wet or dry etching may be used to remove the corrosion resistant layer and the optional seed layer. One technique that could be used is electroless under bump metallurgy (UBM). FIG. 5D shows a similar structure to that shown in FIG. 5B and discussed above. FIGS. 5C and 5D show a later fabrication state and before forming the final interconnect. FIG. 5D may also include a capping structure.

Figure 6A:
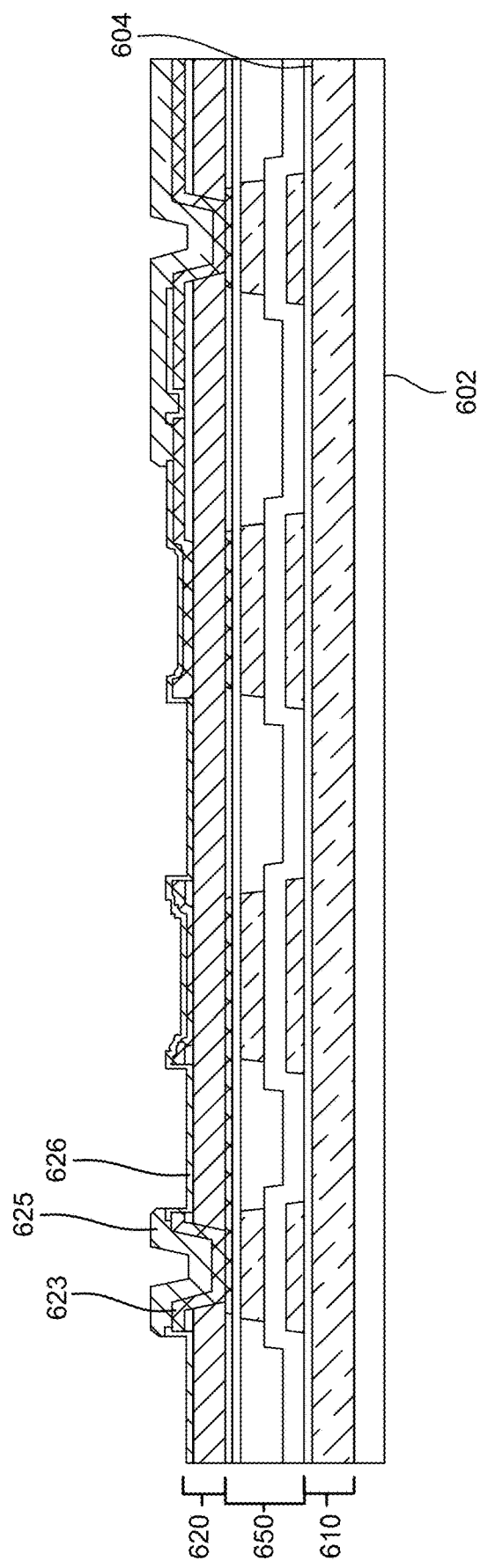
FIGS. 6A-6H illustrate various exemplary configurations and associated processing steps in accordance with some examples of the disclosure.

FIGS. 6A-H illustrate exemplary stacking configurations. Please note that Figures are simplified to show the progression of the process flow. The underlying structure is the same as that discussed in FIGS. 1A-C. If there is a same structure mentioned the naming convention is to replace the reference number with a "6" in front of the reference number. For example, in FIG. 1A, the substrate is labeled as 102. In FIG. 6, the substrate is labeled 602. In FIG. 1A the base layer is labeled as 110. In FIG. 6A, the base layer is labeled as 610. This convention is used throughout.

FIG. 6A illustrates a base layer 610, a support layer 650, a piezoelectric structure 620, a passivation layer 604, a base layer 610 and a substrate 602. Also, shown are a contact pad 623, a corrosion resistant pad 625 and a first dielectric layer 626. In one example, these contacts may be formed by the sputter deposition of contacts.

An exemplary material stacking configuration in accordance with this disclosure may include Al/Cu, SiN, AlSc30N255, Mo, W on Ti, SiO2 and Si. Other material stacks and configurations may be used in accordance with other examples of the disclosure.

Figure 6B:
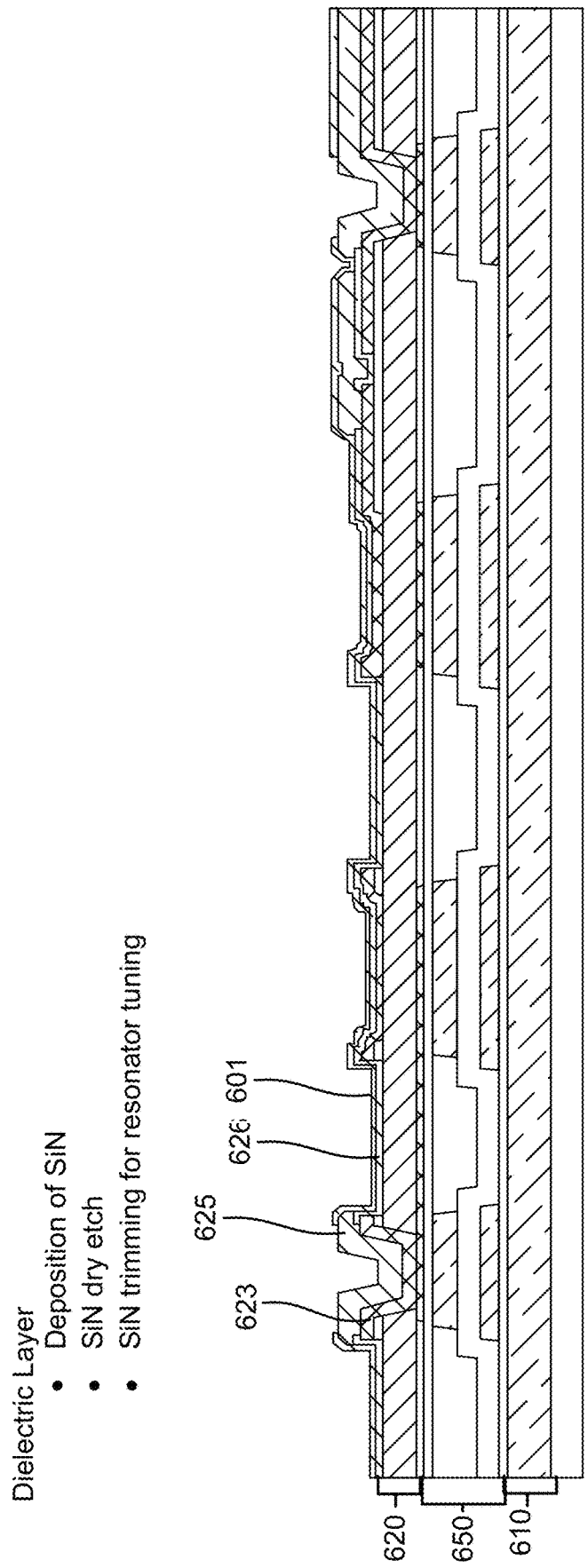

FIG. 6B illustrates a base layer 610, a support layer 650, a piezoelectric structure 620, and a second dielectric layer 601. This dielectric layer may also be referred to as a trimming layer.

Also, shown are a contact pad 623, a corrosion resistant pad 625 and a first dielectric layer 626 with holes. The dielectric layer may also serve as an insulating layer, although that is an ancillary benefit that it provides.

FIG. 6B is also where one may frequency tune the resonator. Tuning is normally done on a top layer (e.g. the SiN layer). To secure the tuning, it is important to make sure that no additional mass or mass elements are layered on the top layer of a SiN layer, since this additional mass would change and otherwise impact the tuning. It should also be noted that the tuning does not have to be done in one process step, but may also be done at other steps throughout the manufacturing process.

An exemplary material stacking configuration in accordance with this disclosure may include AlCu, SiN, AlSc30N255, Mo, W on Ti, SiO2 and Si. Other material stacks and configurations may be used in accordance with other examples of the disclosure.

Figure 6C:
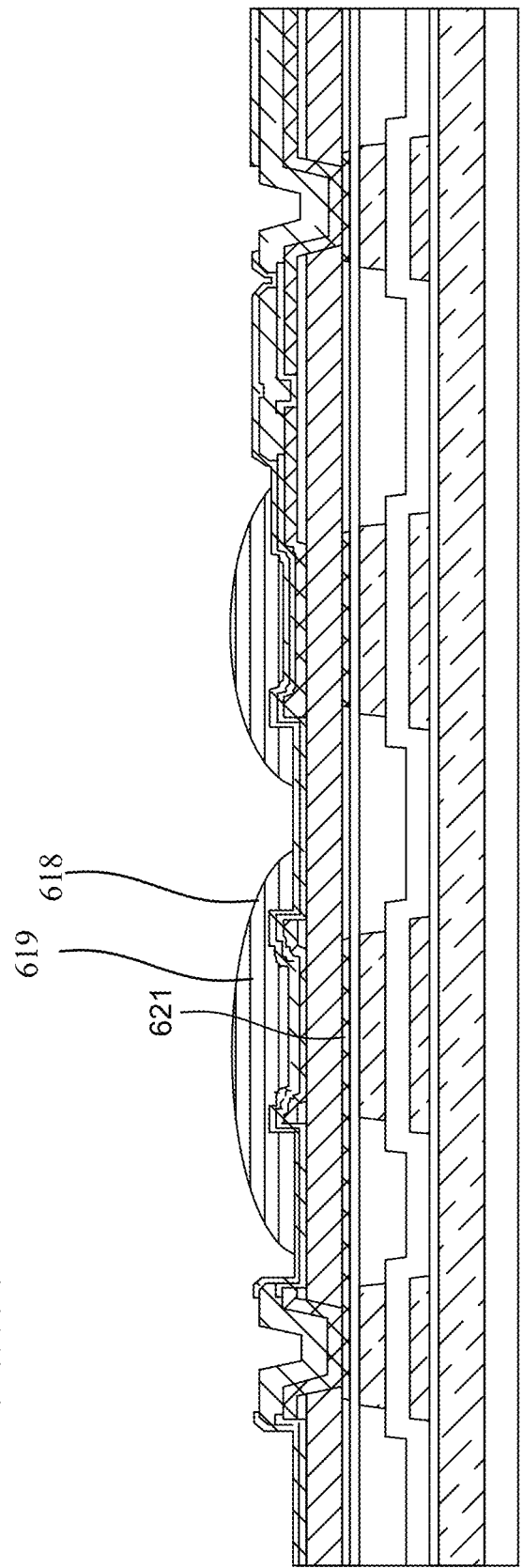

FIG. 6C illustrates the deposition and structuring of a sacrificial resist layer 619 which is also cured. The Fluoro-Silane covered part of the dielectric layer due to its changed hydrophobicity, helps to prevent an outflow and therefore, better structural resolutions are obtained.

The surface of the SL 618 is treated with Fluoro-Silane to help avoid or reduce the outflow of resist. It is also desirable to treat the adjacent surfaces that are located near to the SL resist in the same manner. A bottom electrode 621 is also shown.

An exemplary material stacking configuration in accordance with this disclosure may include AlCu, SiN, AlSc30N255, Mo, W on Ti, SiO2 and Si. Other material stacks and configurations may be used in accordance with other examples of the disclosure.

Figure 6D:
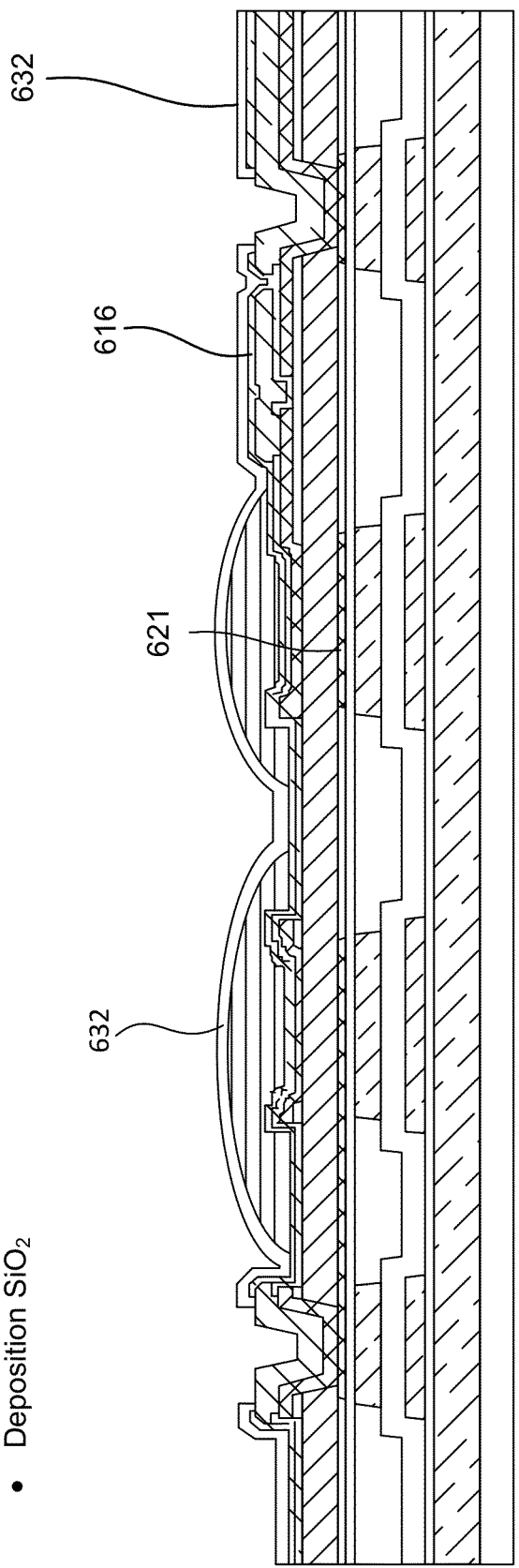

In the processing area occurring between the processes depicted in FIGS. 6C and 6D the Fluoro-Silane passivation process (FIG. 3) may be performed. As discussed previously, the Fluoro-Silane process helps to establish more well-formed and defined boundaries and delineations.

FIG. 6D illustrates a capping process with a deposition of SiO2. It includes a capping layer 632, a bottom electrode 621, and a silicon nitride top dielectric layer 616.

Figure 6E:
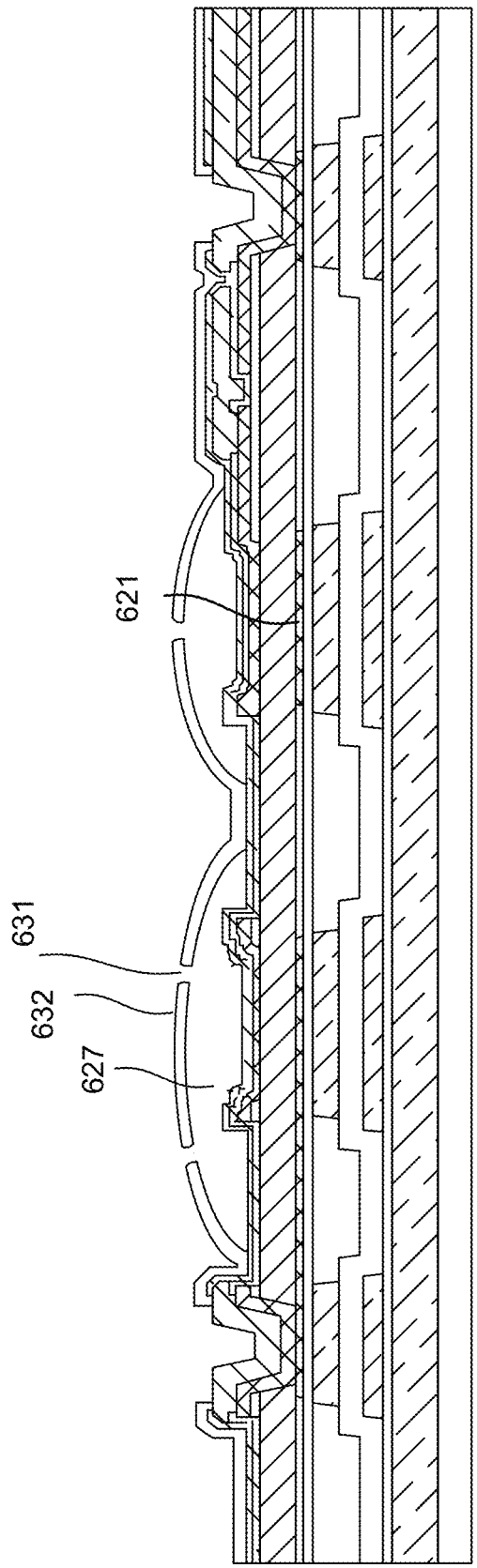

FIG. 6E illustrates a capping release process which may include a SiO2 dry etch, as well as a release of the sacrificial resist.

FIG. 6E further illustrates a capping layer 632, an air gap (or cavity) 627 under the capping layer 632 forming a dome like structure. Also shown are holes 631 in the capping layer to provide access underneath the capping layer.

An exemplary material stacking configuration in accordance with this disclosure may include AlCu, SiN, AlSc30N255, Mo, W on Ti, SiO2 and Si. Other material stacks and configurations may be used in accordance with other examples of the disclosure.

Figure 6F:
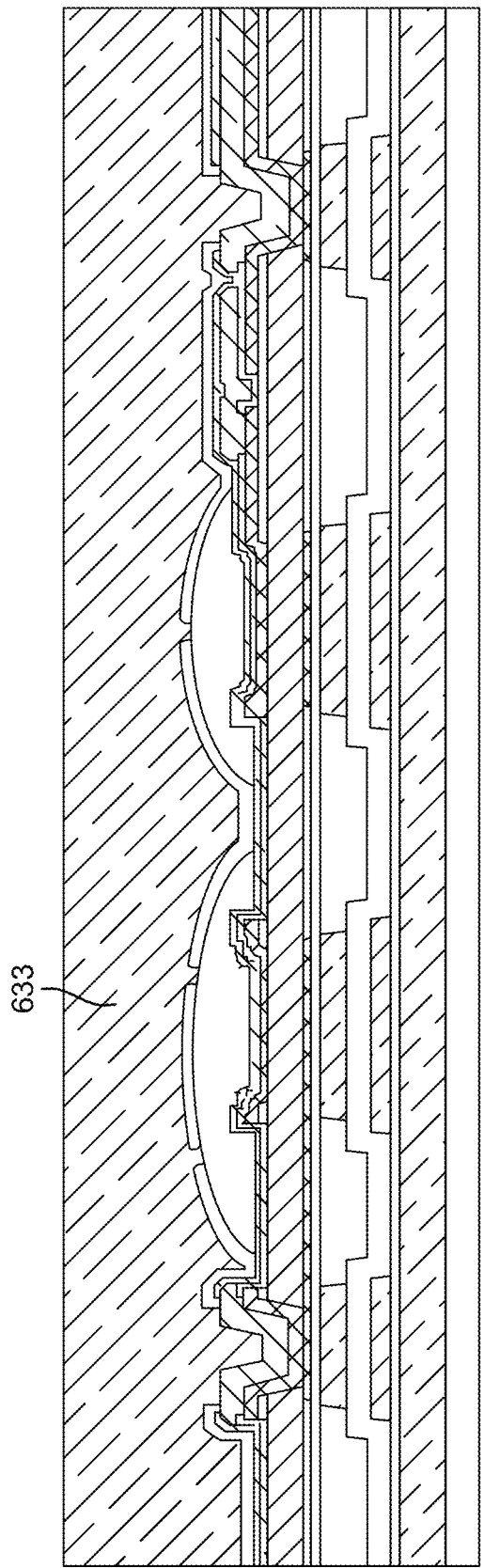

FIG. 6F illustrates the addition of a sealant layer 633. For example, this sealant layer may be formed by a deposition of BCB.

An exemplary material stack in accordance with this disclosure may include Al/Cu, SiN, AlSc30N255, Mo, W on Ti, SiO2 and Si. Other material stacks and configurations may be used in accordance with other examples of the disclosure.

Figure 6G:
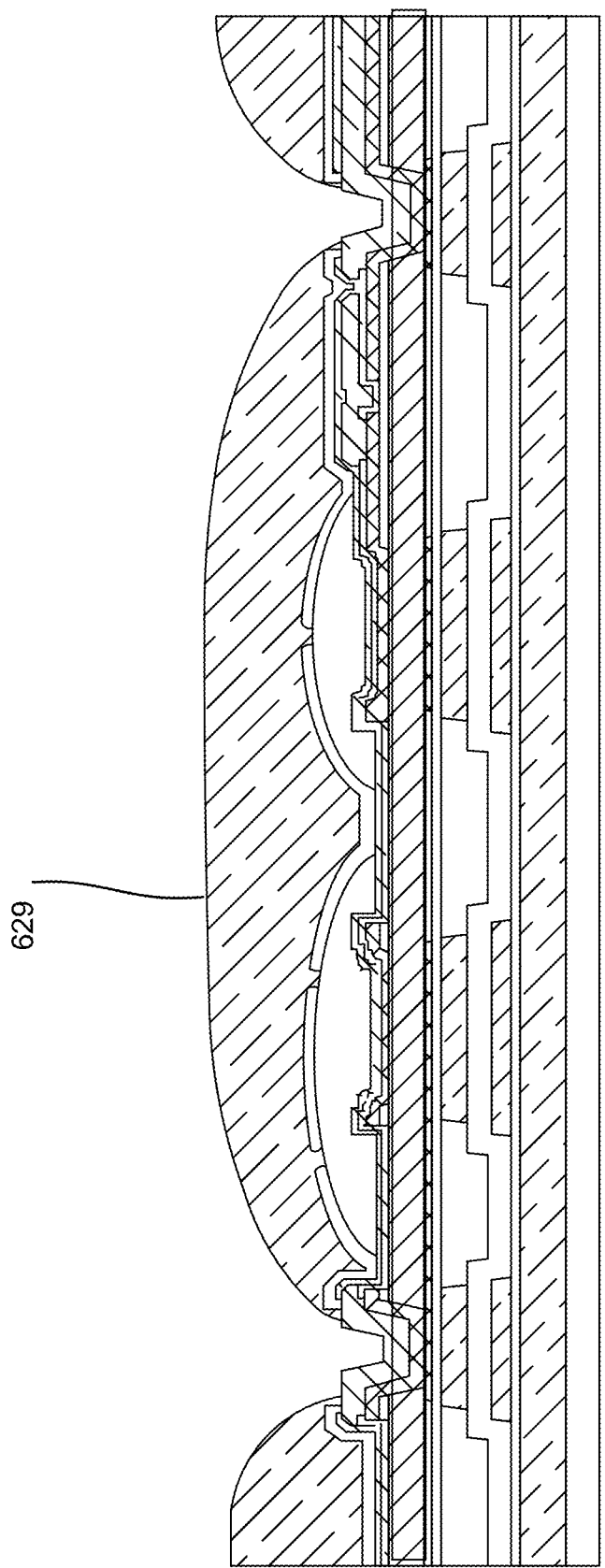

FIG. 6G illustrates a top layer 629 on the top of the sealant layer. Structuring and shaping of the sealant layer enables access to the contact pads, while protecting the remaining structure. In some examples, the sealing layer may be BCB, epoxy or polyimide. Another alternative that may be used is Su-8, which is a commonly used epoxy-based photo resist.

Figure 6H:
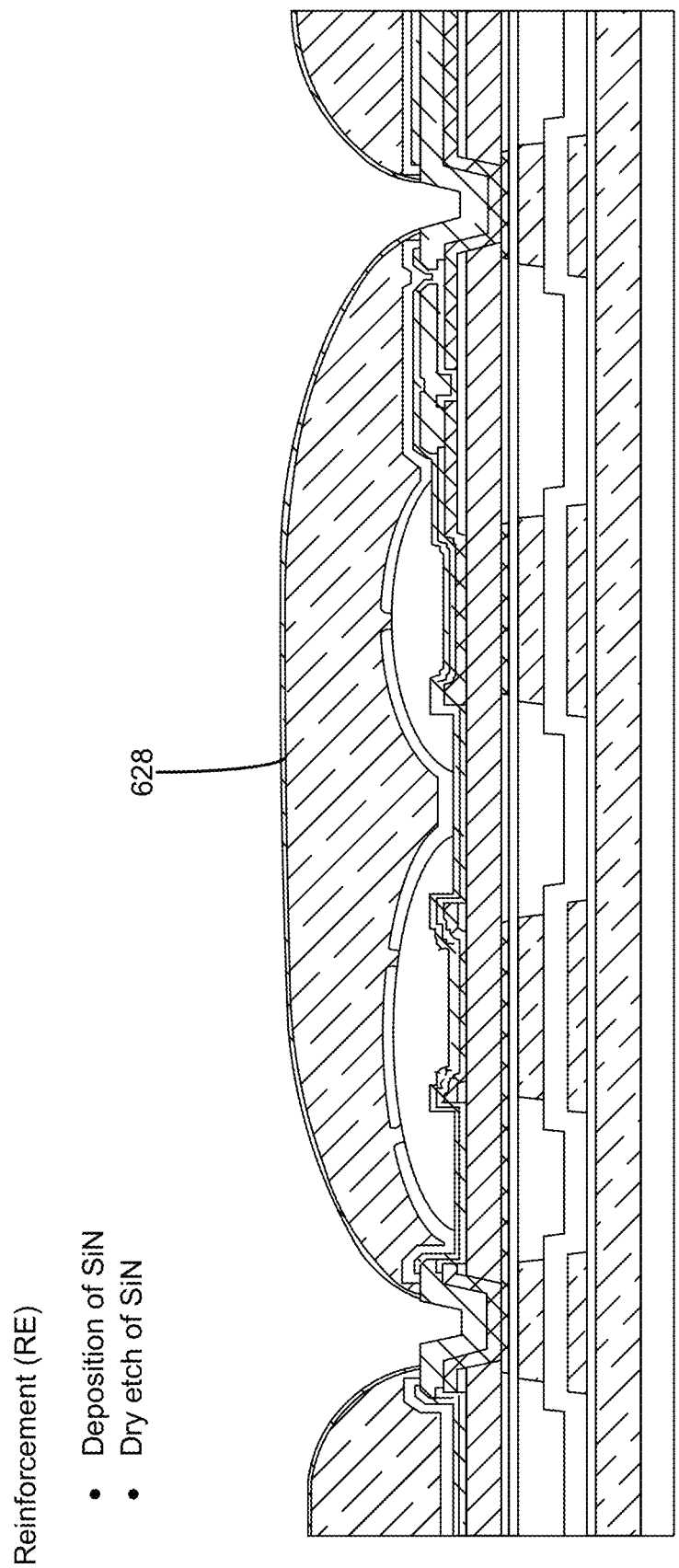

FIG. 6H illustrates the deposition of SiN as well as a dry etch of the SiN to form a reinforcement layer 628.

An exemplary material stack in accordance with this disclosure may include Al/Cu, SiN, AlSc30N255, Mo, W on Ti, SiO2 and Si. Other material stacks and configurations may be used in accordance with other examples of the disclosure.

Figure 7:
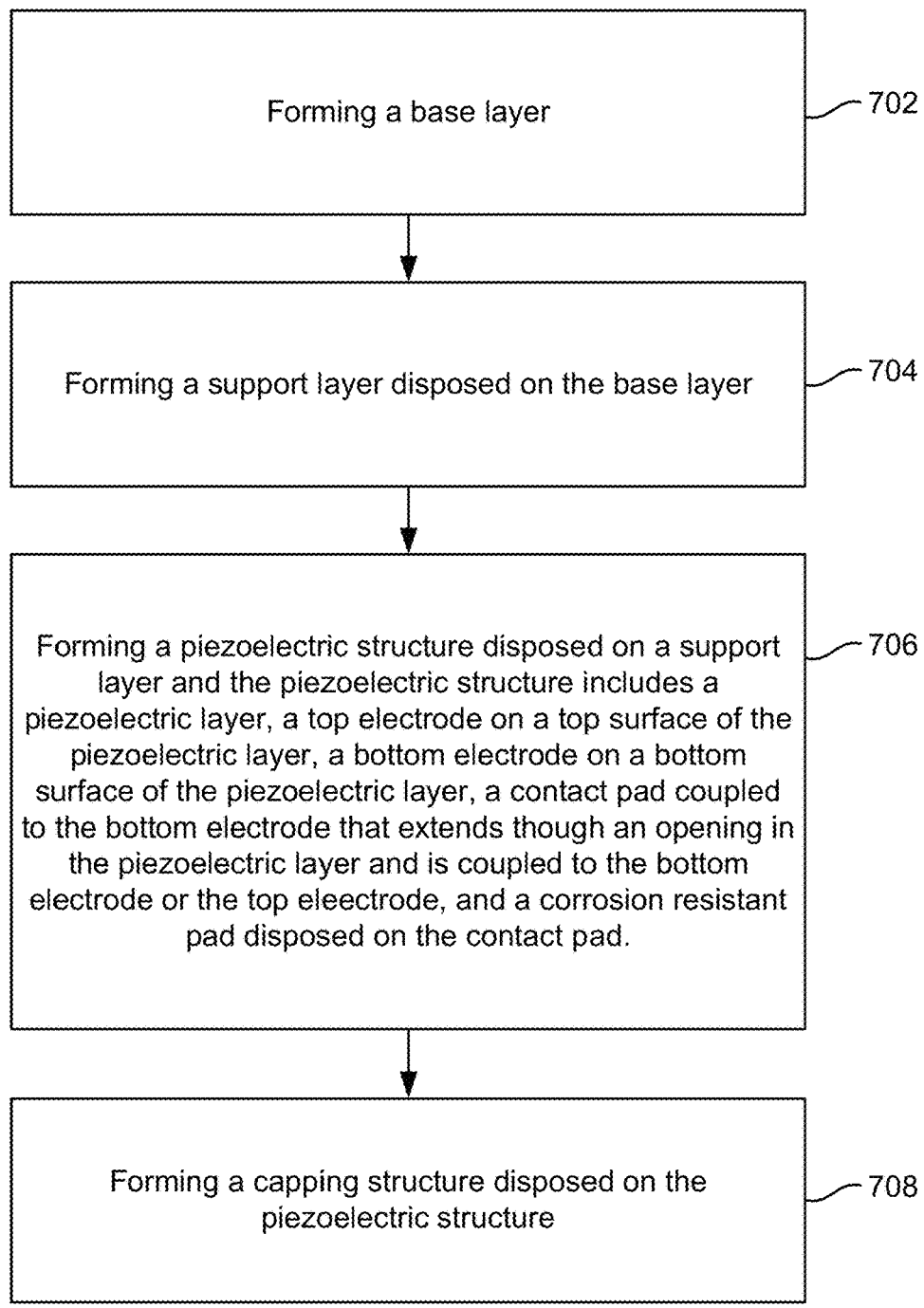
FIG. 7 illustrates an exemplary method of manufacture in accordance with some examples of the disclosure.

FIG. 7 illustrates an exemplary method of manufacture in accordance with some examples of the disclosure.

A base layer is formed 702. A support layer is formed that is disposed on the base layer 704. In 706 the following is performed. Forming a piezoelectric structure disposed on a support layer. The piezoelectric structure includes: forming a piezoelectric layer; forming a top electrode on a top surface of the piezoelectric layer; forming a bottom electrode on a bottom surface of the piezoelectric layer; and forming a contact pad coupled to the bottom electrode that extends through an opening in the piezoelectric layer. A capping structure is formed that is disposed on the piezoelectric structure 708.

Figure 8:
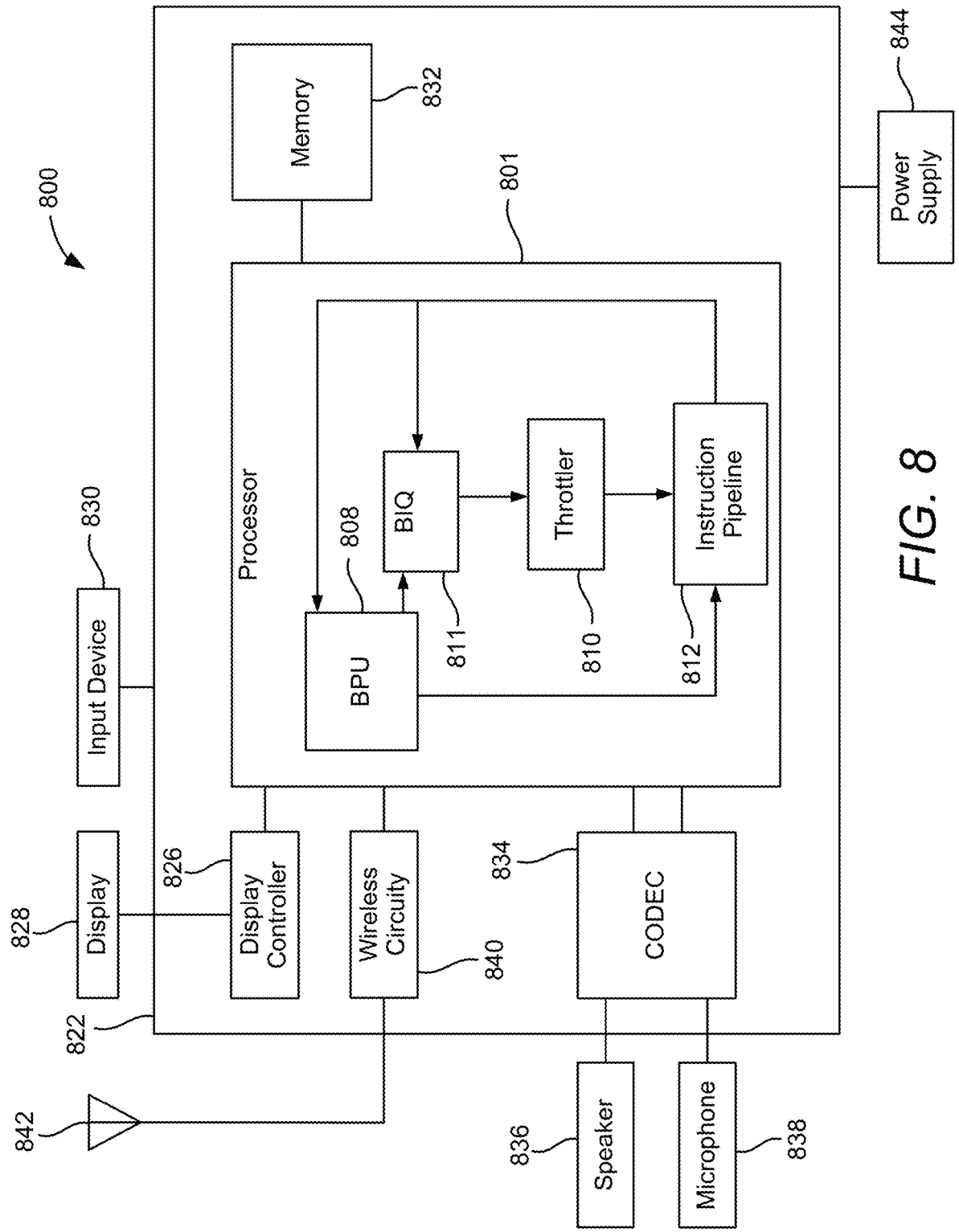
FIG. 8 illustrates various electronic devices that may be integrated with any of the methods, devices, semiconductor devices, integrated circuits, die, interposers, packages, or package-on-packages (PoPs) in accordance with some examples of the disclosure.

FIG. 8 illustrates an exemplary mobile device in accordance with some examples of the disclosure. Referring now to FIG. 8, a block diagram of a mobile device that is configured according to exemplary aspects is depicted and generally designated 800. In some aspects, mobile device 800 may be configured as a wireless communication device. As shown, mobile device 800 includes processor 801, which may be configured to implement some aspects of the methods described herein. Processor 801 is shown to comprise instruction pipeline 812, buffer processing unit (BPU) 808, branch instruction queue (BIQ) 811, and throttler 810 and are well known in the art. Other well-known details (e.g., counters, entries, confidence fields, weighted sum, comparator, etc.) of these blocks have been omitted from this view of processor 801 for the sake of clarity.

Processor 801 may be communicatively coupled to memory 832 over a link, which may be a die-to-die or chip-to-chip link. Mobile device 800 also include display 828 and display controller 826, with display controller 826 coupled to processor 801 and to display 828.

In some aspects, FIG. 8 may include coder/decoder (CO-DEC) 834 (e.g., an audio and/or voice CODEC) coupled to processor 801; speaker 836 and microphone 838 coupled to CODEC 834; and wireless controller 840 (which may include a modem) coupled to wireless antenna 842 and to processor 801.

In a particular aspect, where one or more of the above-mentioned blocks are present, processor 801, display controller 826, memory 832, CODEC 834, and wireless controller 840 can be included in a system-in-package or system-on-chip device 822. Input device 830 (e.g., physical or virtual keyboard), power supply 844 (e.g., battery), display 828, input device 830, speaker 836, microphone 838, wireless antenna 842, and power supply 844 may be external to system-on-chip device 822 and may be coupled to a component of system-on-chip device 822, such as an interface or a controller.

It should be noted that although FIG. 8 depicts a mobile device, processor 801 and memory 832 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 9:
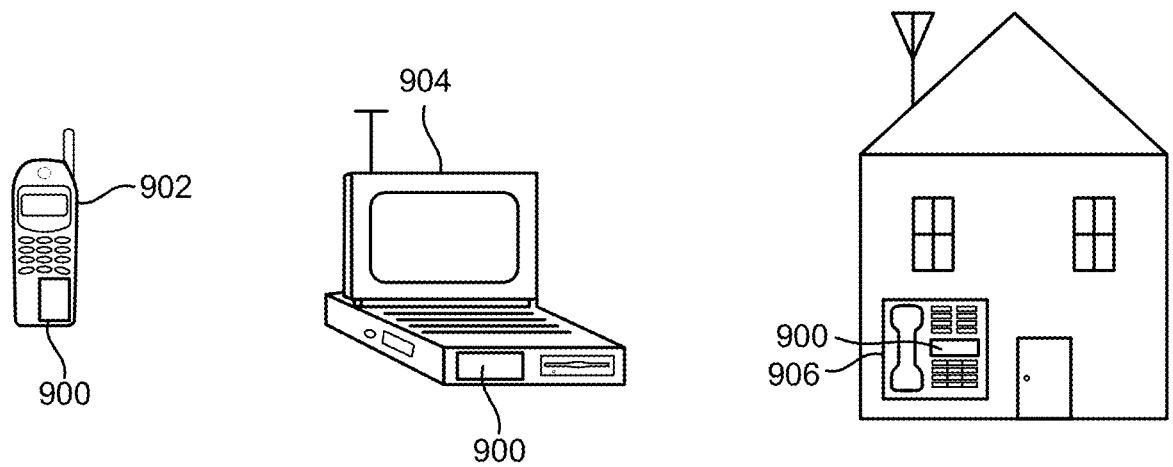
FIG. 9 illustrates an exemplary mobile device in accordance with some examples of the disclosure.

FIG. 9 illustrates various electronic devices that may be integrated with any of the aforementioned integrated device, semiconductor device, integrated circuit, die, interposer, package or package-on-package (PoP) in accordance with some examples of the disclosure. For example, a mobile phone device 902, a laptop computer device 904, and a fixed location terminal device 906 may include an integrated device 900 as described herein. The integrated device 900 may be, for example, any of the integrated circuits, dies, integrated devices, integrated device packages, integrated circuit devices, device packages, integrated circuit (IC) packages, package-on-package devices described herein. The devices 902, 904, 906 illustrated in FIG. 9 are merely exemplary. Other electronic devices may also feature the integrated device 900 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

It will be appreciated that various aspects disclosed herein can be described as functional equivalents to the structures, materials and/or devices described and/or recognized by those skilled in the art. It should furthermore be noted that methods, systems, and apparatus disclosed in the description or in the claims can be implemented by a device comprising means for performing the respective actions of this method. For example, in one aspect, a package may comprise: a core; a first means for metallization (e.g., first metallization structure) on a first side of the core; a second means for metallization (e.g., second metallization structure) on a second side of the core opposite the first side; a first means for support (e.g., first layer) on the first means for metallization opposite the core; a second means for support (e.g., second layer) on the second means for metallization opposite the core; and a first device, the first device located in the core, on the first means for support opposite the first means for metallization, or on the second means for support opposite the second means for metallization. It will be appreciated that the aforementioned aspects are merely provided as examples and the various aspects claimed are not limited to the specific references and/or illustrations cited as examples.

One or more of the components, processes, features, and/or functions illustrated in the Figures may be rearranged and/or combined into a single component, process, feature or function or incorporated in several components, processes, or functions. Additional elements, components, processes, and/or functions may also be added without departing from the disclosure. It should also be noted that the Figures and their corresponding description in the present disclosure is not limited to dies and/or ICs. In some implementations, the Figures and their corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer. An active side of a device, such as a die, is the part of the device that contains the active components of the device (e.g. transistors, resistors, capacitors, inductors etc.), which perform the operation or function of the device. The backside of a device is the side of the device opposite the active side. As used herein, a metallization structures may include metal layers, vias, pads, or traces with dielectric between, such as a redistribution layer or RDL).

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wire line connection, or other connection, regardless of whether satellite signal reception, assistance data reception, and/or position-related processing occurs at the device or at the other device. In addition, these terms are intended to include all devices, including wireless and wire line communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wire line phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to an uplink/reverse or downlink/forward traffic channel.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5 (both expressly incorporated herein in their entirety).

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples and is not intended to be limiting of examples of the disclosure. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, actions, operations, elements, and/or components, but do not preclude the presence or addition of one or more other features, integers, actions, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Nothing stated or illustrated depicted in this application is intended to dedicate any component, action, feature, benefit, advantage, or equivalent to the public, regardless of whether the component, action, feature, benefit, advantage, or the equivalent is recited in the claims.

The methods, sequences and/or algorithms described in connection with the examples disclosed herein may be incorporated directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art including non-transitory types of memory or storage mediums. An exemplary storage medium is coupled to the processor such that the processor can read information from, and write information to, the storage medium. In the alternative, the storage medium may be integral to the processor.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

In the detailed description above it can be seen that different features are grouped together in examples. This manner of disclosure should not be understood as an intention that the example clauses have more features than are explicitly mentioned in each clause. Rather, the various aspects of the disclosure may include fewer than all features of an individual example clause disclosed. Therefore, the following clauses should hereby be deemed to be incorporated in the description, wherein each clause by itself can stand as a separate example. Although each dependent clause can refer in the clauses to a specific combination with one of the other clauses, the aspect(s) of that dependent clause are not limited to the specific combination. It will be appreciated that other example clauses can also include a combination of the dependent clause aspect(s) with the subject matter of any other dependent clause or independent clause or a combination of any feature with other dependent and independent clauses. The various aspects disclosed herein expressly include these combinations, unless it is explicitly expressed or can be readily inferred that a specific combination is not intended (e.g., contradictory aspects, such as defining an element as both an insulator and a conductor). Furthermore, it is also intended that aspects of a clause can be included in any other independent clause, even if the clause is not directly dependent on the independent clause.

Implementation examples are described in the following numbered clauses:

Clause 1. An apparatus including an acoustic filter package comprising: a base layer; a support layer disposed on the base layer; a piezoelectric structure disposed on the support layer, wherein the piezoelectric structure comprises: a piezoelectric layer; a top electrode on a top surface of the piezoelectric layer; a bottom electrode on a bottom surface of the piezoelectric layer; a contact pad coupled to the bottom electrode that extends through an opening in the piezoelectric layer and is coupled to the bottom electrode or the top electrode; a corrosion resistant pad disposed on the contact pad; and a capping structure disposed on the piezoelectric structure.

Clause 2. The apparatus of clause 1, wherein the base layer further comprises: a substrate; and a passivation layer disposed on the substrate.

Clause 3. The apparatus of clause 2, wherein the substrate is silicon (Si) and the passivation layer is silicon dioxide (SiO2).

Clause 4. The apparatus of any of clauses 1 to 3, wherein the support layer comprises one or more dielectric layers.

Clause 5. The apparatus of clause 4, wherein the support layer comprises one or more metal layers, each metal layer being separated by at least one of the one or more dielectric layers.

Clause 6. The apparatus of clause 5, wherein the one or more metal layers comprises: a first metal layer disposed on the base layer forming a first plurality of mirrors; and a second metal layer forming a second plurality of mirrors, wherein the second metal layer is adjacent the piezoelectric structure and above the first metal layer.

Clause 7. The apparatus of clause 6, wherein the one or more metal layers each comprises tungsten (W) deposited on titanium (Ti).

Clause 8. The apparatus of any of clauses 1 to 7 further comprising: a contact coupled to the contact pad through an opening in the corrosion resistant pad.

Clause 9. The apparatus of clause 8, wherein the contact comprises a conductive pillar and a solder cap.

Clause 10. The apparatus of clause 9, wherein the conductive pillar is copper and the solder cap is a tin silver (SnAg) solder cap.

Clause 11. The apparatus of any of clauses 1 to 10, wherein the capping structure comprises: a capping layer deposited over the piezoelectric structure, wherein the capping layer forms an air gap over the top electrode.

Clause 12. The apparatus of clause 11, wherein the capping structure further comprises: a sealing layer deposited over the capping layer, wherein the capping layer forms an air gap over the top electrode.

Clause 13. The apparatus of clause 12, wherein the capping structure further comprises: a reinforcement layer deposited over sealing layer.

Clause 14. The apparatus of any of clauses 12 to 13, wherein the capping layer is SiO2 or silicon nitride (SiN), the sealing layer is Benzocyclobutene (BCB), epoxy or polyimide and the reinforcement layer is silicon nitride (SiN).

Clause 15. The apparatus of any of clauses 1 to 14, wherein the piezoelectric structure further comprises: a first dielectric layer deposited over the piezoelectric structure, the top electrode and at least partially over the contact pad;

and a second dielectric layer deposited over the first dielectric layer and at least partially over the corrosion resistant pad.

Clause 16. The apparatus of clause 15, wherein the first dielectric layer and the second dielectric layer are both silicon nitride (SiN).

Clause 17. The apparatus of any of clauses 1 to 16, wherein the piezoelectric layer is aluminum scandium nitride (AlScN).

Clause 18. The apparatus of clause 17, wherein the corrosion resistant pad has an extended portion.

Clause 19. The apparatus of any of clauses 1 to 18, wherein the acoustic filter package further comprises a plurality of capacitors.

Clause 20. The apparatus of any of clauses 1 to 19, wherein the corrosion resistant pad is formed from multiple layers.

Clause 21. The apparatus of clause 20, wherein the corrosion resistant pad is formed from a corrosion resistant layer deposited on a seed layer.

Clause 22. The apparatus of clause 21, wherein the corrosion resistant layer is at least one of Molybdenum (Mo), Tungsten (W), Chromium (Cr) and Ruthenium (Ru) and the seed layer is Ti, TiN or Cr.

Clause 23. The apparatus of any of clauses 21 to 22, wherein the corrosion resistant layer is formed from a plurality of layers.

Clause 24. The apparatus of clause 23, wherein the plurality of layers comprise Molybdenum (Mo) deposited on gold (Au) deposited on Molybdenum (Mo).

Clause 25. The apparatus of any of clauses 23 to 24, wherein the plurality of layers comprise Molybdenum (Mo) deposited on Tungsten (W).

Clause 26. The apparatus of any of clauses 1 to 25, wherein the contact pad is formed from multiple layers.

Clause 27. The apparatus of clause 26, wherein the contact pad is formed from aluminum copper (AlCu) deposited on a seed layer.

Clause 28. The apparatus of any of clauses 26 to 27, wherein the contact pad is at least one of aluminum (Al), copper (Cu), Al(Si, Pd, Sc) or alloys thereof.

Clause 29. The apparatus of any of clauses 1 to 28, wherein the apparatus is selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, a base station and a device in an automotive vehicle.

Clause 30. A method for manufacturing an apparatus including an acoustic filter package comprising: forming a base layer; forming a support layer disposed on the base layer; forming a piezoelectric structure disposed on the support layer, wherein the piezoelectric structure comprises: forming a piezoelectric layer; forming a top electrode on a top surface of the piezoelectric layer; forming a bottom electrode on a bottom surface of the piezoelectric layer; forming a contact pad coupled to the bottom electrode that extends through an opening in the piezoelectric layer and is coupled to the bottom electrode or the top electrode; forming a corrosion resistant pad disposed on the contact pad; and forming a capping structure disposed on the piezoelectric structure.

Clause 31. The method of clause 30, wherein the base layer further comprises: a substrate; and a passivation layer disposed on the substrate.

Clause 32. The method of clause 31, wherein the substrate is silicon and the passivation layer is silicon dioxide.

Clause 33. The method of any of clauses 30 to 32, wherein the support layer comprises one or more dielectric layers.

Clause 34. The method of clause 33, wherein the support layer comprises one or more metal layers, each metal layer being separated by at least one of the one or more dielectric layers.

Clause 35. The method of clause 34, wherein the one or more metal layers comprises: a first metal layer disposed on the base layer forming a first plurality of mirrors; and a second metal layer forming a second plurality of mirrors, wherein the second metal layer is adjacent the piezoelectric structure and above the first metal layer.

Clause 36. The method of clause 35, wherein the one or more metal layers each comprises tungsten (W) deposited on titanium (Ti).

Clause 37. The method of any of clauses 30 to 36 further comprising: a contact coupled to the contact pad through an opening in the corrosion resistant pad.

Clause 38. The method of clause 37, wherein the contact comprises a conductive pillar and a solder bump.

Clause 39. The method of clause 38, wherein the conductive pillar is copper.

Clause 40. The method of any of clauses 30 to 39, wherein the capping structure comprises: a capping layer deposited over the piezoelectric structure, wherein the capping layer forms an air gap over the top electrode.

Clause 41. The method of clause 40, wherein the capping structure further comprises: a sealing layer deposited over the capping layer, wherein the capping layer forms an air gap over the top electrode; and a reinforcement layer deposited over sealing layer.

Clause 42. The method of clause 41, wherein the capping layer is SiO2, the sealing layer is Benzocyclobutene (BCB) and the reinforcement layer is silicon nitride (SiN).

Clause 43. The method of any of clauses 30 to 42, wherein the piezoelectric structure further comprises: a first dielectric layer deposited over the piezoelectric structure, the top electrode and at least partially over the contact pad; and a second dielectric layer deposited over the first dielectric layer and at least partially over the corrosion resistant pad.

Clause 44. The method of clause 43, wherein the first dielectric layer and the second dielectric layer are both silicon nitride (SiN).

Clause 45. The method of any of clauses 30 to 44, wherein the piezoelectric layer is aluminum scandium nitride (AlScN).

Clause 46. The method of any of clauses 30 to 45, wherein the corrosion resistant pad is generally circular in shape.

Clause 47. The method of clause 46, wherein the corrosion resistant pad has an extended portion.

Clause 48. The method of any of clauses 30 to 47, wherein the acoustic filter package further comprises a plurality of capacitors.

Clause 49. The method of any of clauses 30 to 48, wherein the corrosion resistant pad is formed from multiple layers.

Clause 50. The method of clause 49, wherein the corrosion resistant pad is formed from a corrosion resistant layer deposited on a seed layer.

Clause 51. The method of clause 50, wherein the corrosion resistant layer is at least one of Molybdenum (Mo), Tungsten (W), Chromium (Cr) and Ruthenium (Ru) and the seed layer is Ti, TiN or Cr.

Clause 52. The method of any of clauses 50 to 51, wherein the corrosion resistant layer is formed from a plurality of layers.

Clause 53. The method of clause 52, wherein the plurality of layers comprise Molybdenum (Mo) deposited on gold (Au) deposited on Molybdenum (Mo).

Clause 54. The method of any of clauses 52 to 53, wherein the plurality of layers comprise Molybdenum (Mo) deposited on Tungsten (W).

Clause 55. The method of any of clauses 30 to 54, wherein the contact pad is formed from multiple layers.

Clause 56. The method of clause 55, wherein the contact pad is formed from aluminum copper (AlCu) deposited on a seed layer.

Clause 57. The method of any of clauses 55 to 56, wherein the contact pad is at least one of aluminum (Al), copper (Cu), Al(Si, Pd, Sc) or alloys thereof.

Clause 58. The method of any of clauses 30 to 57, wherein the apparatus is selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, a base station and a device in an automotive vehicle.

What is claimed is:

1. An apparatus including an acoustic filter package comprising:
   a base layer;
   a support layer disposed on the base layer;
   a piezoelectric structure disposed on the support layer, wherein the piezoelectric structure comprises:
      a piezoelectric layer;
      a top electrode on a top surface of the piezoelectric layer;
      a bottom electrode on a bottom surface of the piezoelectric layer;
      a contact pad coupled to the bottom electrode that extends through an opening in the piezoelectric layer and is coupled to the bottom electrode or the top electrode;
      a corrosion resistant pad disposed on the contact pad;
      a capping structure disposed on the piezoelectric structure;
      a first dielectric layer over the piezoelectric layer, the top electrode, and at least a portion of the contact pad; and
      a second dielectric layer over the first dielectric layer and at least a portion of the corrosion resistant pad, and
   wherein the portion of the corrosion resistant pad is over a portion of the first dielectric layer that is over the portion of the contact pad.

2. The apparatus of claim 1, wherein the corrosion resistant pad is formed from multiple layers.

3. The apparatus of claim 2, wherein the corrosion resistant pad is formed from a corrosion resistant layer deposited on a seed layer.

4. The apparatus of claim 3, wherein the corrosion resistant layer is formed from a plurality of layers.

5. The apparatus of claim 4, wherein the plurality of layers comprise Molybdenum (Mo) deposited on gold (Au) deposited on Molybdenum (Mo).

6. The apparatus of claim 4, wherein the plurality of layers comprise Molybdenum (Mo) deposited on Tungsten (W).

7. The apparatus of claim 3, wherein the corrosion resistant layer is at least one of Molybdenum (Mo), Tungsten (W), Chromium (Cr) and Ruthenium (Ru) and the seed layer is Ti, TiN or Cr.

8. The apparatus of claim 1, wherein the support layer comprises one or more dielectric layers.

9. The apparatus of claim 8, wherein the support layer comprises one or more metal layers, each metal layer being separated by at least one of the one or more dielectric layers.

10. The apparatus of claim 9, wherein the one or more metal layers comprises:
   a first metal layer disposed on the base layer forming a first plurality of mirrors; and
   a second metal layer forming a second plurality of mirrors, wherein the second metal layer is adjacent the piezoelectric structure and above the first metal layer.

11. The apparatus of claim 10, wherein the one or more metal layers each comprises tungsten (W) deposited on titanium (Ti).

12. The apparatus of claim 1, wherein the capping structure comprises:
   a capping layer deposited over the piezoelectric structure, wherein the capping layer forms an air gap over the top electrode.

13. The apparatus of claim 12, wherein the capping structure further comprises:
   a sealing layer deposited over the capping layer, wherein the capping layer forms an air gap over the top electrode.

14. The apparatus of claim 13, wherein the capping structure further comprises:
   a reinforcement layer deposited over sealing layer.

15. The apparatus of claim 14, wherein the capping layer is $SiO_2$ or silicon nitride (SiN), the sealing layer is Benzocyclobutene (BCB), epoxy or polyimide and the reinforcement layer is silicon nitride (SiN).

16. The apparatus of claim 1 further comprising:
   a contact coupled to the contact pad through an opening in the corrosion resistant pad.

17. The apparatus of claim 16, wherein the contact comprises a conductive pillar and a solder cap.

18. The apparatus of claim 17, wherein the conductive pillar is copper and the solder cap is a tin silver (SnAg) solder cap.

19. The apparatus of claim 1, wherein the contact pad is formed from multiple layers.

20. The apparatus of claim 19, wherein the contact pad is formed from aluminum copper (AlCu) deposited on a seed layer.

21. The apparatus of claim 19, wherein the contact pad is at least one of aluminum (Al), copper (Cu), Al(Si, Pd, Sc) or alloys thereof.

22. The apparatus of claim 1, wherein the base layer further comprises:
   a substrate; and
   a passivation layer disposed on the substrate.

23. The apparatus of claim 22, wherein the substrate is silicon (Si) and the passivation layer is silicon dioxide ($SiO_2$).

24. The apparatus of claim 1, wherein the piezoelectric layer is aluminum scandium nitride (AlScN).

25. The apparatus of claim 24, wherein the corrosion resistant pad has an extended portion.

26. The apparatus of claim 1, wherein the first dielectric layer and the second dielectric layer are both silicon nitride (SiN).

27. The apparatus of claim 1, wherein the acoustic filter package further comprises a plurality of capacitors.

28. The apparatus of claim 1, wherein the apparatus is selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, a base station and a device in an automotive vehicle.

29. A method for manufacturing an apparatus including an acoustic filter package comprising:
forming a base layer;
forming a support layer disposed on the base layer;
forming a piezoelectric structure disposed on the support layer,
wherein the forming the piezoelectric structure comprises:
forming a piezoelectric layer;
forming a top electrode on a top surface of the piezoelectric layer;
forming a bottom electrode on a bottom surface of the piezoelectric layer;
forming a contact pad coupled to the bottom electrode that extends through an opening in the piezoelectric layer and is coupled to the bottom electrode or the top electrode;
forming a first dielectric layer over the piezoelectric structure, the top electrode, and at least a portion of the contact pad;
forming a corrosion resistant pad disposed on the contact pad;
forming a second dielectric layer over the first dielectric layer and at least a portion of the corrosion resistant pad; and
forming a capping structure disposed on the piezoelectric structure,
wherein the portion of the corrosion resistant pad is over a portion of the first dielectric layer that is over the portion of the contact pad.

30. The method of claim 29, wherein the corrosion resistant pad is formed from multiple layers.

31. The method of claim 30, wherein the corrosion resistant pad is formed from a corrosion resistant layer deposited on a seed layer.

32. The method of claim 31, wherein the corrosion resistant layer is formed from a plurality of layers.

33. The method of claim 32, wherein the plurality of layers comprise Molybdenum (Mo) deposited on gold (Au) deposited on Molybdenum (Mo).

34. The method of claim 32, wherein the plurality of layers comprise Molybdenum (Mo) deposited on Tungsten (W).

35. The method of claim 31, wherein the corrosion resistant layer is at least one of Molybdenum (Mo), Tungsten (W), Chromium (Cr) and Ruthenium (Ru) and the seed layer is Ti, TiN or Cr.

36. The method of claim 29, wherein the support layer comprises one or more dielectric layers.

37. The method of claim 36, wherein the support layer comprises one or more metal layers, each metal layer being separated by at least one of the one or more dielectric layers.

38. The method of claim 37, wherein the one or more metal layers comprises:
a first metal layer disposed on the base layer forming a first plurality of mirrors; and
a second metal layer forming a second plurality of mirrors, wherein the second metal layer is adjacent the piezoelectric structure and above the first metal layer.

39. The method of claim 38, wherein the one or more metal layers each comprises tungsten (W) deposited on titanium (Ti).

40. The method of claim 29 further comprising:
a contact coupled to the contact pad through an opening in the corrosion resistant pad.

41. The method of claim 40, wherein the contact comprises a conductive pillar and a solder bump.

42. The method of claim 41, wherein the conductive pillar is copper.

43. The method of claim 29, wherein the capping structure comprises:
a capping layer deposited over the piezoelectric structure, wherein the capping layer forms an air gap over the top electrode.

44. The method of claim 43, wherein the capping structure further comprises:
a sealing layer deposited over the capping layer, wherein the capping layer forms an air gap over the top electrode; and
a reinforcement layer deposited over sealing layer.

45. The method of claim 44, wherein the capping layer is $SiO_2$, the sealing layer is Benzocyclobutene (BCB) and the reinforcement layer is silicon nitride (SiN).

46. The method of claim 29, wherein the contact pad is formed from multiple layers.

47. The method of claim 46, wherein the contact pad is formed from aluminum copper (AlCu) deposited on a seed layer.

48. The method of claim 46, wherein the contact pad is at least one of aluminum (Al), copper (Cu), Al(Si, Pd, Sc) or alloys thereof.

49. The method of claim 29, wherein the base layer further comprises:
a substrate; and
a passivation layer disposed on the substrate.

50. The method of claim 49, wherein the substrate is silicon and the passivation layer is silicon dioxide.

51. The method of claim 29, wherein the corrosion resistant pad is generally circular in shape.

52. The method of claim 34, wherein the corrosion resistant pad has an extended portion.

53. The method of claim 29, wherein the first dielectric layer and the second dielectric layer are both silicon nitride (SiN).

54. The method of claim 29, wherein the piezoelectric layer is aluminum scandium nitride (AlScN).

55. The method of claim 29, wherein the acoustic filter package further comprises a plurality of capacitors.

56. The method of claim 29, wherein the apparatus is selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, a base station and a device in an automotive vehicle.

* * * * *